United States Patent
Du et al.

(10) Patent No.: US 12,114,544 B2
(45) Date of Patent: Oct. 8, 2024

(54) DISPLAY PANEL AND DISPLAY DEVICE WITH SUB-PIXEL ANODES HAVING NOTCHES

(71) Applicants: Chengdu BOE Optoelectronics Technology Co., Ltd., Chengdu (CN); BOE Technology Group Co., Ltd., Beijing (CN)

(72) Inventors: Lili Du, Beijing (CN); Hongjun Zhou, Beijing (CN); Feng Wei, Beijing (CN); Qian Ma, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 679 days.

(21) Appl. No.: 17/418,900

(22) PCT Filed: Sep. 29, 2020

(86) PCT No.: PCT/CN2020/119087
§ 371 (c)(1),
(2) Date: Jun. 28, 2021

(87) PCT Pub. No.: WO2022/067581
PCT Pub. Date: Apr. 7, 2022

(65) Prior Publication Data
US 2022/0310753 A1    Sep. 29, 2022

(51) Int. Cl.
*H10K 59/131* (2023.01)
*H10K 59/122* (2023.01)
(Continued)

(52) U.S. Cl.
CPC ......... *H10K 59/131* (2023.02); *H10K 59/122* (2023.02); *H10K 59/124* (2023.02);
(Continued)

(58) Field of Classification Search
CPC .. H10K 59/131; H10K 59/353; H10K 59/122; H10K 59/124; G09G 3/30; G09G 2300/0426
See application file for complete search history.

(56) References Cited

U.S. PATENT DOCUMENTS 11,251,231 B2 * 2/2022 Dai ................... H10K 59/352
2013/0176195 A1   7/2013 Kim
(Continued)

FOREIGN PATENT DOCUMENTS

CN   107579099 A   1/2018
CN   107871775 A   4/2018
(Continued)

OTHER PUBLICATIONS

Non Final Office Action for U.S. Appl. No. 17/424,769 dated Dec. 15, 2023.

*Primary Examiner* — Lex H Malsawma
(74) *Attorney, Agent, or Firm* — ArentFox Schiff LLP; Michael Fainberg

(57) ABSTRACT

Embodiments of the disclosure provide a display panel and a display device. The display panel includes: a base substrate, a transistor array layer, a first planarization layer, and a first electrode layer, wherein the plurality of sub-pixels include first color sub-pixels and second color sub-pixels adjacent to the first color sub-pixels in a first direction; for the first color sub-pixels and the second color sub-pixels adjacent in the first direction, first notches are disposed in sides, facing orthographical projections of anodes in the first color sub-pixels on the base substrate, of orthographical projections of edges of anodes in the second color sub-pixels on the base substrate; and the first notches are disposed facing centers of main parts of the second color sub-pixels.

(Continued)

Each repeating unit includes at least one first color sub-pixel and at least one second color sub-pixel.

20 Claims, 15 Drawing Sheets

(51) Int. Cl.
    *H10K 59/124* (2023.01)
    *H10K 59/35* (2023.01)
    *G09G 3/30* (2006.01)

(52) U.S. Cl.
    CPC ............. *H10K 59/353* (2023.02); *G09G 3/30* (2013.01); *G09G 2300/0426* (2013.01)

(56) References Cited

U.S. PATENT DOCUMENTS

| | | | |
|---|---|---|---|
| 2013/0234917 A1* | 9/2013 | Lee | H10K 59/353 345/82 |
| 2014/0239259 A1 | 8/2014 | Lim et al. | |
| 2015/0102320 A1 | 4/2015 | Jung | |
| 2015/0200237 A1* | 7/2015 | Yim | H10K 59/131 257/40 |
| 2016/0260792 A1* | 9/2016 | Kim | H10K 59/131 |
| 2016/0285029 A1 | 9/2016 | Jeon et al. | |
| 2017/0317145 A1* | 11/2017 | Hong | G06F 3/0412 |
| 2018/0190752 A1* | 7/2018 | An | H10K 59/1213 |
| 2018/0351127 A1 | 12/2018 | So et al. | |
| 2019/0131371 A1* | 5/2019 | Yi | H01L 27/1255 |
| 2020/0343320 A1 | 10/2020 | Zeng et al. | |
| 2021/0135149 A1 | 5/2021 | Xin et al. | |
| 2021/0193766 A1 | 6/2021 | Liu et al. | |

FOREIGN PATENT DOCUMENTS

| | | |
|---|---|---|
| CN | 110046611 A | 7/2019 |
| CN | 110707134 A | 1/2020 |
| CN | 111490068 A | 8/2020 |

\* cited by examiner

DISPLAY PANEL AND DISPLAY DEVICE WITH SUB-PIXEL ANODES HAVING NOTCHES

CROSS REFERENCE TO RELATED APPLICATIONS

The present application is a US National Stage of International Application No. PCT/CN2020/119087, filed on Sep. 29, 2020, the content of which is incorporated by reference herein in its entirety.

FIELD

Embodiments of the disclosure relate to the technical field of display, in particular to a display panel and a display device.

BACKGROUND

With the continuous development of display technology, organic light emitting diode (OLED) display panels have been increasingly applied to various electronic equipment due to their advantages such as self-luminescence, wide viewing angle, high contrast, low power consumption, and high response speed. With increasing demands on the OLED display panels, the OLED display panels typically employ Sub-pixel Rendering (SPR) pixel arrangements, i.e., a manner in which pixels are borrowed, in order to achieve high resolution designs in the display panels.

SUMMARY

A display panel provided by an embodiment of the disclosure, includes:
 a base substrate, comprising a plurality of sub-pixels;
 a transistor array layer disposed on the base substrate and comprising anode adaptor portions each located in a respective one of the plurality of sub-pixels;
 a first planarization layer, disposed on a side of the transistor array layer facing away from the base substrate; and
 a first electrode layer, disposed on a side of the first planarization layer facing away from the base substrate and comprising anodes each located in the respective one of the plurality of sub-pixels; wherein
 each anode comprises a main part and a via hole part electrically connected to each other;
 in the respective one of the plurality of sub-pixels: the via hole part is electrically connected with the anode adaptor portion through a first via hole; and the first via hole runs through the first planarization layer;
 wherein
 the plurality of sub-pixels comprise first color sub-pixels and second color sub-pixels adjacent to the first color sub-pixels in a first direction; and orthographical projections of first via holes in the first color sub-pixels on the base substrate are located between orthographical projections of main parts in the first color sub-pixels on the base substrate and orthographical projections of main parts in the second color sub-pixels on the base substrate;
 for the first color sub-pixels and the second color sub-pixels adjacent to the first color pixels in the first direction, sides of orthographical projections of anodes in the second color sub-pixels on the base substrate facing to orthographical projections of anodes in the first color sub-pixels on the base substrate have notches; and the first notches are convex toward centers of the main parts of the second color sub-pixels;
 wherein the display panel comprises a plurality of repeating units, and each repeating unit comprises at least one of the first color sub-pixels and at least one of the second color sub-pixels; and
 every two adjacent repeating units have at least two of the first notches and two of the first via holes; and in the first direction, the at least two of the first notches and the at least two of the first via holes of at least two adjacent repeating units are arranged on a same straight line.

In some embodiments, in the same repeating unit, an orthographical projection of the first notch for the anode in the second color sub-pixel in a second direction covers an orthographical projection of the first via hole in the first color sub-pixel in the second direction.

In some embodiments, in the same sub-pixel, an orthographical projection of the via hole part on the base substrate covers an orthographical projection of the first via hole on the base substrate; and the first notch is provided in the main part in the second color sub-pixel, and an orthographical projection of the first notch in the second direction covers an orthographical projection of the via hole part in the first color sub-pixel in the second direction.

In some embodiments, an edge of an orthographical projection of the first notch on the base substrate is substantially parallel to an edge of the orthographical projection of the via hole part in the first color sub-pixel on the base substrate.

In some embodiments, a first distance between the edge of the orthographical projection of each first notch on the base substrate and the edge of the orthographical projection of the via hole part in each first color sub-pixel on the base substrate is 2.5 μm to 20 μm.

In some embodiments, the first color sub-pixels are red sub-pixels, and the second color sub-pixels are green sub-pixels; and the transistor array layer includes driving transistors located in the sub-pixels; and orthographical projections of anodes in the green sub-pixels on the base substrate and orthographical projections of channel regions of the driving transistors in the red sub-pixels on the base substrate have overlapping areas.

In some embodiments, orthographical projections of anodes in the red sub-pixels on the base substrate and the orthographical projections of the channel regions of the driving transistors on the base substrate do not overlap.

In some embodiments, the transistor array layer includes: a plurality of scan lines, a plurality of reset lines and a plurality of light emitting control lines, which are arranged alternately; and one repeating unit corresponds to at least one of the plurality of scan line, at least one of the plurality of reset line and at least one of the plurality of light emitting control line; and
 in one repeating unit, an orthographical projection of the reset line on the base substrate and an orthographical projection of the anode in the red sub-pixel controlled by the reset line on the base substrate do not overlap, an orthographical projection of the light emitting control line on the base substrate and an orthographical projection of the anode in the green sub-pixel controlled by the light emitting control line on the base substrate have an overlapping area, and an orthographical projection of the scan line on the base substrate and orthographical projections of the anodes controlled by the scan line on the base substrate do not overlap.

In some embodiments, the transistor array layer further includes an active layer of conducting control transistors in the sub-pixels; and in the same sub-pixel, the anode adaptor portion is electrically connected with a conductor region of the active layer of the conducting control transistor through a second via hole;

orthographical projections of first via holes and second via holes in the red sub-pixels on the base substrate have first overlapping areas;

orthographical projections of first via holes and second via holes in the green sub-pixels on the base substrate have second overlapping areas; and an area of each first overlapping area is not greater than that of each second overlapping area.

In some embodiments, the area of each first overlapping area is 0 to 0.9 µm², and the area of each second overlapping area is 0 to 0.9 µm².

In some embodiments, the first color sub-pixels are green sub-pixels, and the second color sub-pixels are blue sub-pixels; and orthographical projections of anodes in the blue sub-pixels on the base substrate and orthographical projections of channel regions of driving transistors in the green sub-pixels on the base substrate have overlapping areas.

In some embodiments, in the same blue sub-pixel, the orthographical projection of the anode on the base substrate and the orthographical projection of the channel region of the driving transistor on the base substrate have an overlapping area.

In some embodiments, for one repeating unit, an orthographical projection of a light emitting control line controlling the one repeating unit on the base substrate partially overlaps respectively with orthographical projections of an anode in a blue sub-pixel and an anode in a green sub-pixel in the one repeating unit on the base substrate, and orthographical projections of a reset line and a scan line controlling the one repeating unit on the base substrate and the orthographical projections of respective anodes in the one repeating unit on the base substrate do not overlap.

In some embodiments, orthographical projections of first via holes and second via holes in the green sub-pixels on the base substrate have second overlapping areas, orthographical projections of first via holes and second via holes in the blue sub-pixels on the base substrate have third overlapping areas, and an area of each third overlapping area is 0 to 9 µm².

In some embodiments, the area of each third overlapping area is less than or equal to an area of each second overlapping area.

In some embodiments, each repeating unit further includes at least one third color sub-pixel; and anodes in a first color sub-pixel, a second color sub-pixel and a third color sub-pixel which are adjacent to one another locates respectively at three vertices of a triangle.

In some embodiments, in the same repeating unit, an orthographical projection of the first via hole in the second color sub-pixel on the base substrate is located between orthographical projections of the via hole part in the first color sub-pixel and a main part in the third color sub-pixel on the base substrate, orthographical projections of the first via hole in the second color sub-pixel, the via hole part in the first color sub-pixel and the main part in the third color sub-pixel on the base substrate are disposed on a same straight line, and the straight line is substantially parallel to the first direction.

In some embodiments, in the same repeating unit, a side of the orthographical projection of the main part in the third color sub-pixel on the base substrate facing the orthographical projection of the first via hole in the second color sub-pixel on the base substrate has a second notch.

In some embodiments, in the same repeating unit, an orthographical projection of the second notch of the main part in the third color sub-pixel in the first direction and an orthographical projection of the first via hole in the second color sub-pixel in the first direction at least partially overlap.

In some embodiments, in the same repeating unit, the orthographical projection of the second notch of the main part in the third color sub-pixel in the first direction covers the orthographical projection of the first via hole in the second color sub-pixel in the first direction.

In some embodiments, in the same repeating unit, the orthographical projection of the second notch of the main part in the third color sub-pixel in the first direction covers an orthographical projection of the via hole part in the second color sub-pixel in the first direction.

In some embodiments, an edge of an orthographical projection of each second notch on the base substrate is substantially parallel to an edge of an orthographical projection of the main part in each second color sub-pixel on the base substrate.

In some embodiments, a second distance between the edge of the orthographical projection of each second notch on the base substrate and the edge of the orthographical projection of the main part in each second color sub-pixel on the base substrate is 2.5 to 20 µm.

In some embodiments, an orthographical projection of a first via hole in each third color sub-pixel on the base substrate is disposed on a side of the orthographical projection of each second notch on the base substrate facing away from the orthographical projection of the via hole part in each second color sub-pixel on the base substrate.

In some embodiments, the anodes in the first color sub-pixels further include first connecting parts electrically connected between the main parts and the via hole parts; and the first connecting parts extend in the first direction.

In some embodiments, the anodes in the second color sub-pixels further include second connecting parts electrically connected between the main parts and the via hole parts;

the second connecting parts extend in a third direction; and the third direction is different from the first direction and the second direction.

In some embodiments, in the same repeating unit, the orthographical projection of the anode in the third color sub-pixel on the base substrate respectively has overlapping areas with orthographical projections of the reset line and the light emitting control line controlling a pixel circuit in the repeating unit on the base substrate.

In some embodiments, the first via holes in the repeating units which are adjacent in the second direction are approximately arranged in the second direction in sequence.

In some embodiments, orthographical projections, in the first direction, of the first via holes in the repeating units which are adjacent in the second direction overlap.

A display panel provided by an embodiment of the disclosure, includes:

a base substrate, comprising a plurality of sub-pixels;

a transistor array layer, disposed on the base substrate and comprising anode adaptor portions each located in a respective one of the plurality of sub-pixels;

a first planarization layer, disposed on a side of the transistor array layer facing away from the base substrate;

a first electrode layer, disposed on a side of the first planarization layer facing away from the base substrate and comprising anodes each located in the respective one of the plurality of sub-pixels; wherein an anode in each sub-pixel are electrically connected with the anode adaptor portion through a first via hole; the first via hole runs through the first planarization layer; and each anode comprises a main part and a via hole part; and a pixel defining layer, disposed on a side of the first electrode layer facing away from the base substrate and comprising openings each located in the respective one of the plurality of sub-pixels, wherein in a same sub-pixel: an orthographical projection of an opening on the base substrate is located in an orthographical projection of an anode on the base substrate; wherein the plurality of sub-pixels comprise third color sub-pixels; and in each third color sub-pixel, a side of the orthographical projection of the opening on the base substrate facing an orthographical projection of a first via hole in the third color sub-pixel on the base substrate has an opening notch; and in each third color sub-pixel, a side of an orthographical projection of the main part of the anode on the base substrate facing to an orthographical projection of the first via hole of the anode of the third color sub-pixel on the base substrate has a third notch, and the third notch is substantially parallel to the opening notch.

In some embodiments, in each third color sub-pixel, an orthographical projection of the opening notch in a first direction covers an orthographical projection of the first via hole in the first direction.

In some embodiments, in each third color sub-pixel, an edge of an orthographical projection of the opening notch on the base substrate is substantially parallel to an edge of an orthographical projection of the first via hole on the base substrate.

In some embodiments, in each third color sub-pixel, a third distance between the edge of the orthographical projection of the opening notch on the base substrate and the edge of the orthographical projection of the first via hole on the base substrate is 2.25 μm to 20 μm.

In some embodiments, in each third color sub-pixel, an edge of an orthographical projection of the third notch on the base substrate and the edge of the orthographical projection of the opening notch on the base substrate are overlapped.

In some embodiments, the plurality of sub-pixels further include: first color sub-pixels and second color sub-pixels; and in at least one of the first color sub-pixels and the second color sub-pixels, the orthographical projection of the opening on the base substrate is rectangular.

In some embodiments, an area of an opening in each third color sub-pixel is greater than that of an opening in each second color sub-pixel; and the area of the opening in each second color sub-pixel is greater than that of an opening in each first color sub-pixel.

An embodiment of the disclosure further provides a display device, including the above display panel.

DETAILED DESCRIPTION OF THE EMBODIMENTS

Figure 1:
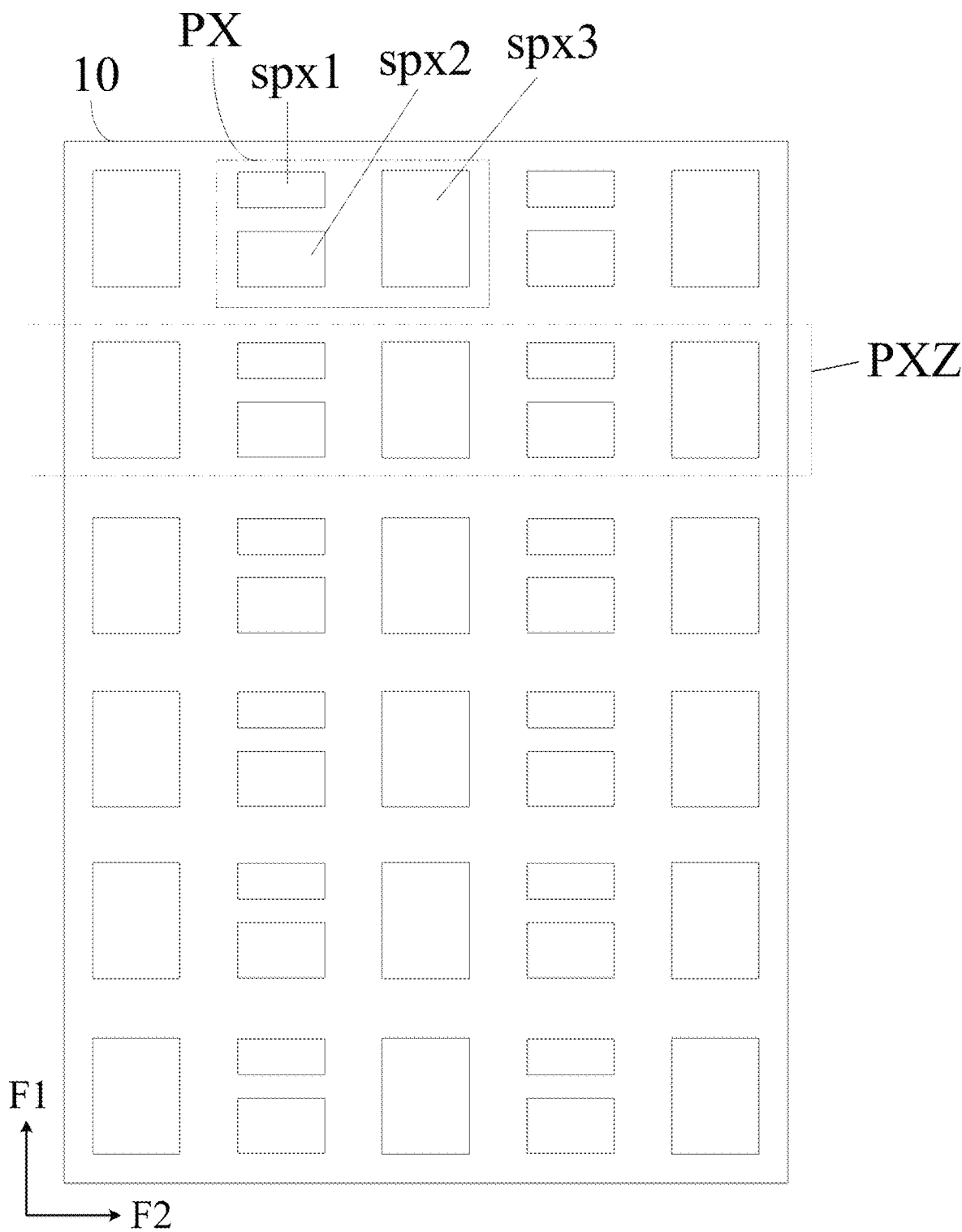
FIG. 1 shows a schematic structural diagram of a display panel provided by embodiments of the disclosure.

In order to make the objectives, technical solutions, and advantages of the embodiments of the disclosure clearer, the technical solutions of the embodiments of the disclosure will be described clearly and completely in the accompanying drawings of the embodiments of the disclosure. It is to be understood that the described embodiments are some, but not all, embodiments of the disclosure. Also, embodiments and features in the embodiments of the disclosure may be combined with one another without conflict. Based on the described embodiments of the disclosure, all other embodiments attainable by one of ordinary skill in the art without involving any inventive effort are within the scope of the disclosure.

Unless otherwise defined, the technical terms or scientific terms used herein shall have the usual meanings understood by those with ordinary skills in the field to which this disclosure belongs. The "first", "second" and similar words used in the specification and claims of the disclosure do not denote any order, quantity or importance, but are only used to distinguish different components. "Including" or "containing" and other similar words mean that an element or article that precedes the word is inclusive of the element or article listed after the word and equivalents thereof, but does not exclude other elements or articles. The terms "connecting" or "connected", and the like, are not limited to physical or mechanical connections, but may include electrical connections, whether direct or indirect.

It should be noted that the dimensions and shapes of the various figures in the drawings are not to scale and are intended to be merely illustrative of the contents of the disclosure. The same or similar reference numerals refer to the same or similar elements or elements having the same or similar functions throughout.

As shown in FIG. 1, a display panel provided by an embodiment of the disclosure may include: a base substrate 10, and a plurality of sub-pixels spx on the base substrate 10. Exemplarily, the plurality of sub-pixels may include red sub-pixels, green sub-pixels and blue sub-pixels. Therefore, the display panel may mix light using the red sub-pixels, the green sub-pixels and the blue sub-pixels, thereby realizing color display. Of course, the embodiment of the disclosure includes, but is not limited to, these.

Figure 2A:
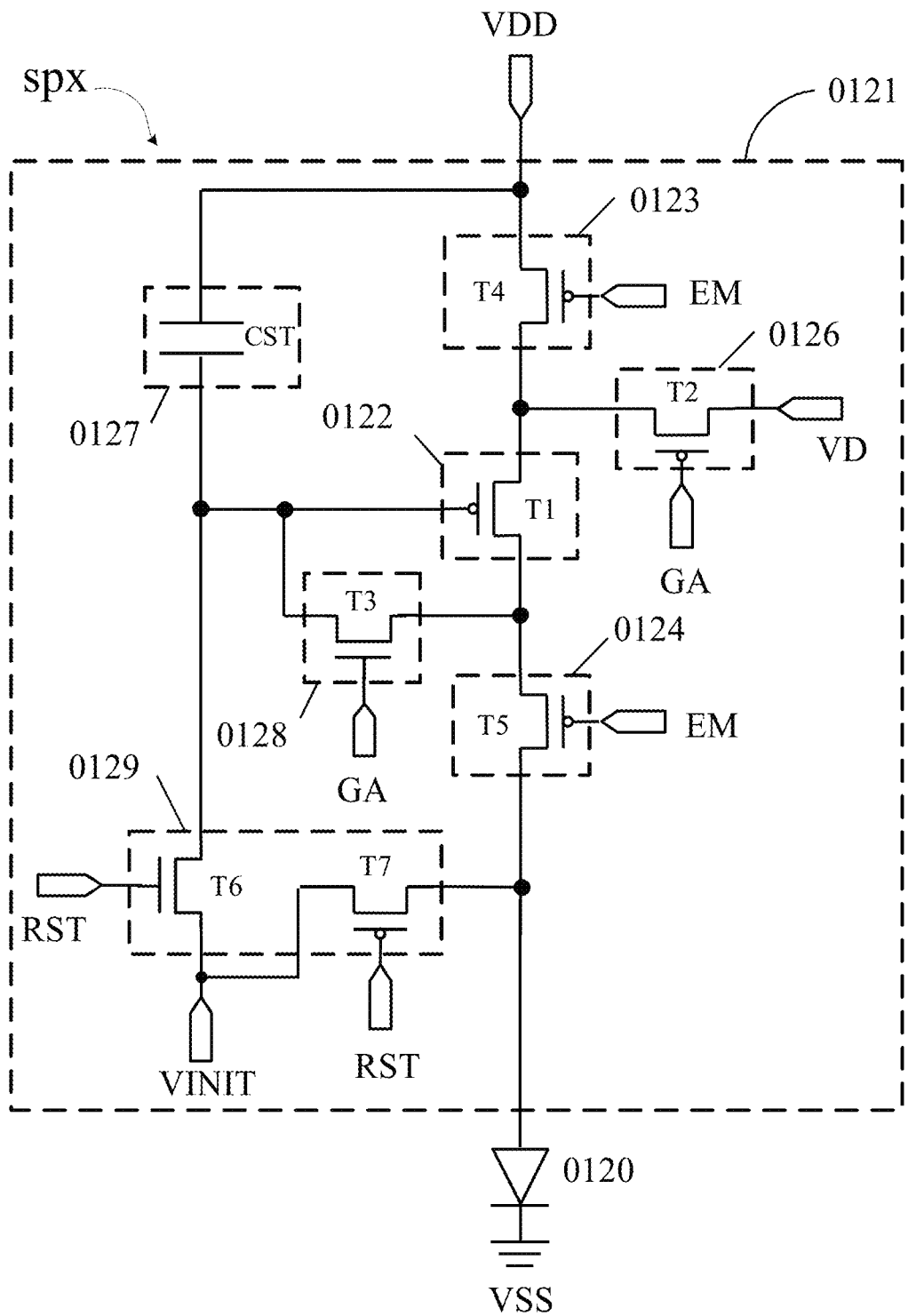
FIG. 2A shows a schematic structural diagram of a pixel circuit provided by embodiments of the disclosure.

Exemplarily, as shown in FIGS. 1 and 2A, at least one sub-pixel spx (e.g., each sub-pixel) of the plurality of sub-pixels spx may include: a pixel circuit 0121 and a light emitting element 0120. The pixel circuit 0121 has transistors and capacitors, and generates electrical signals through the interaction between the transistors and the capacitors, and the generated electrical signals are input into an anode of the light emitting element 0120. A corresponding voltage is applied to a cathode of the light emitting element 0120 to drive the light emitting element 0120 to emit light.

As shown in FIG. 2A, the pixel circuit 0121 may include: a driving control circuit 0122, a first light emitting control circuit 0123, a second light emitting control circuit 0124, a data writing circuit 0126, a storage circuit 0127, a threshold compensation circuit 0128, and a reset circuit 0129.

The driving control circuit 0122 may include a control terminal, a first terminal, and a second terminal, and is configured to provide the light emitting element 0120 a driving current for driving the light emitting element 0120 to emit light. For example, the first light emitting control circuit 0123 is connected to the first terminal of the driving control circuit 0122 and a first voltage terminal VDD, and is configured to connect or disconnect the driving control circuit 0122 and the first voltage terminal VDD.

The second light emitting control circuit 0124 is electrically connected to the second terminal of the driving control circuit 0122 and the anode of the light emitting element 0120, and is configured to connect or disconnect the driving control circuit 0122 and the light emitting element 0120.

The data writing circuit 0126 is electrically connected to the first terminal of the driving control circuit 0122, and is configured to write a signal on a data line VD to the storage circuit 0127.

The storage circuit 0127 is electrically connected to the control terminal of the driving control circuit 0122 and the first voltage terminal VDD, and is configured to store a data signal as well as information of the driving control circuit 0122.

The threshold compensation circuit 0128 is electrically connected to the control terminal and the second terminal of the driving control circuit 0122, and is configured for threshold compensation on the driving control circuit 0122.

The reset circuit 0129 is electrically connected to the control terminal of the driving control circuit 0122 and the anode of the light emitting element 0120, and is configured to reset the anode of the light emitting element 0120 and to reset the control terminal of the driving control circuit 0122.

The light emitting element 0120 may be configured as an electroluminescent diode such as at least one of an OLED, a QLED, a micro LED, and a micro OLED. The light emitting element 0120 may include the anode, a light emitting layer, and the cathode which are stacked in that order. Further, the light emitting layer may also include film layers such as a hole injection layer, a hole transport layer, an electron transport layer, and an electron injection layer. Of course, in a practical application, the light emitting element 0120 may be designed and determined according to requirements of a practical application environment, and is not limited here.

Exemplarily, as shown in FIG. 2A, the driving control circuit 0122 includes: a driving transistor T1, the control terminal of the driving control circuit 0122 includes a gate of the driving transistor T1, the first terminal of the driving control circuit 0122 includes a first electrode of the driving transistor T1, and the second terminal of the driving control circuit 0122 includes a second electrode of the driving transistor T1.

Exemplarily, as shown in FIG. 2A, the data writing circuit 0126 includes a data writing transistor T2. The storage circuit 0127 includes a storage capacitor CST. The threshold compensation circuit 0128 includes a threshold compensation transistor T3. The first light emitting control circuit 0123 includes a light emitting control transistor T4. The second light emitting control circuit 0124 includes a conducting control transistor T5. The reset circuit 0129 includes an initialization transistor T6 and a reset transistor T7.

Specifically, a first electrode of the data writing transistor T2 is electrically connected to the first electrode of the driving transistor T1, a second electrode of the data writing transistor T2 is electrically connected to the data line VD to receive the data signal, and a gate of the data writing transistor T2 is electrically connected to a scan line GA to receive a signal.

A first electrode of the storage capacitor CST is electrically connected to the first power terminal VDD, and a second electrode of the storage capacitor CST is electrically connected to the gate of the driving transistor T1.

A first electrode of the threshold compensation transistor T3 is electrically connected to the second electrode of the driving transistor T1, a second electrode of the threshold compensation transistor T3 is electrically connected to the gate of the driving transistor T1, and a gate of the threshold compensation transistor T3 is electrically connected to the scan line GA to receive a signal.

A first electrode of the initialization transistor T6 is electrically connected to an initialization line VINIT to receive a reset signal, a second electrode of the initialization transistor T6 is electrically connected to the gate of the driving transistor T1, and a gate of the initialization transistor T6 is electrically connected to a reset line RST to receive a signal.

A first electrode of the reset transistor T7 is electrically connected to the initialization line VINIT to receive the reset signal, a second electrode of the reset transistor T7 is electrically connected to the anode of the light emitting element 0120, and a gate of the reset transistor T7 is electrically connected to the reset line RST to receive a signal.

A first electrode of the light emitting control transistor T4 is electrically connected to the first power terminal VDD, a second electrode of the light emitting control transistor T4 is electrically connected to the first electrode of the driving transistor T1, and a gate of the light emitting control transistor T4 is electrically connected to a light emitting control line EM to receive a light emitting control signal.

A first electrode of the conducting control transistor T5 is electrically connected to the second electrode of the driving transistor T1, a second electrode of the conducting control transistor T5 is electrically connected to the anode of the light emitting element 0120, and a gate of the conducting control transistor T5 is electrically connected to the light emitting control line EM to receive a light emitting control signal.

The cathode of the light emitting element 0120 is electrically connected to a second power terminal VSS. The first electrode and the second electrode of each transistor above may be determined as sources or drains according to an actual application, which is not limited here.

Exemplarily, one of the first power terminal VDD and the second power terminal VSS is a high voltage terminal and the other is a low voltage terminal. For example, in the embodiment shown in FIG. 2A, the first power terminal VDD is a voltage source to output a constant first voltage, for example, the first voltage is a positive voltage; and the second power terminal VSS may be a voltage source to output a constant second voltage, for example, the second voltage is 0 or a negative voltage. For example, in some embodiments, the second power terminal VSS may be grounded.

Figure 2B:
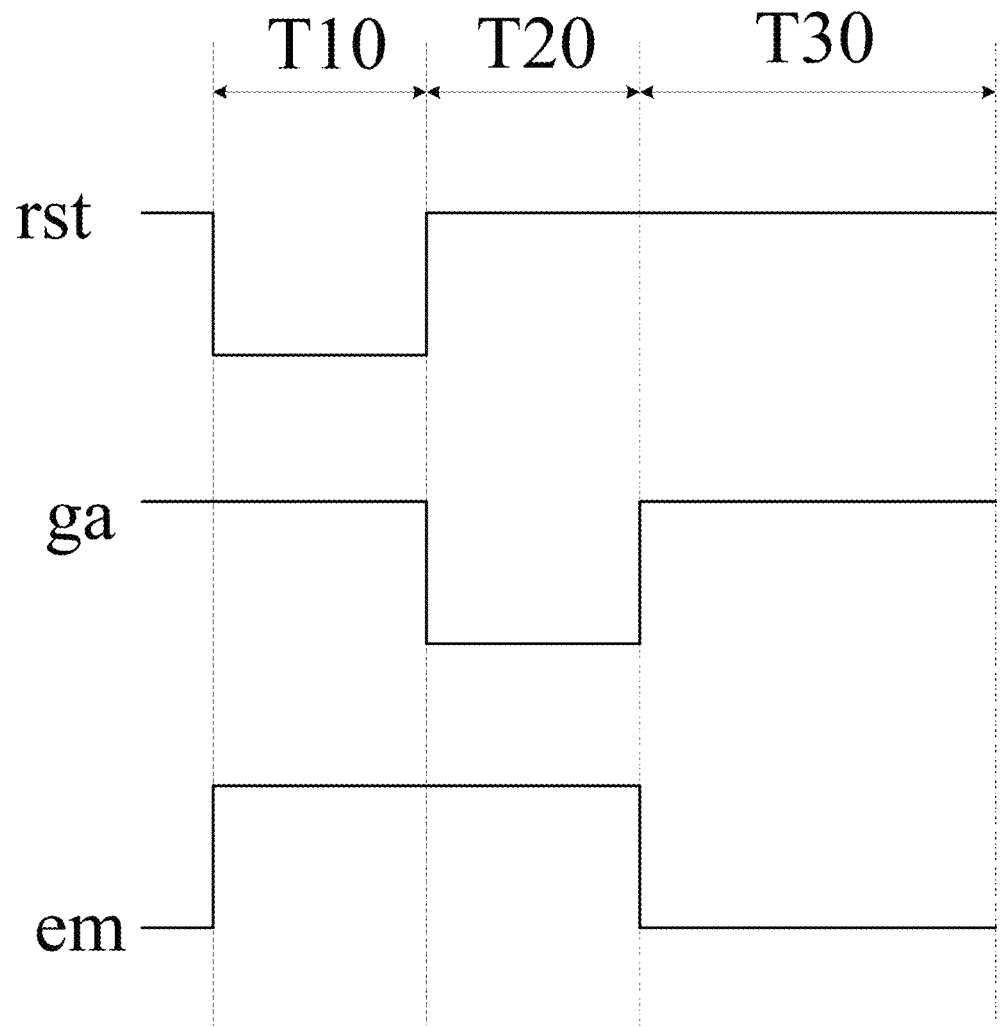
FIG. 2B shows a timing chart of signals provided by embodiments of the disclosure.

FIG. 2B is a timing chart of signals corresponding to the pixel circuit shown in FIG. 2A. In a frame of display time, a working process of the pixel circuit has three stages: T10, T20, and T30, wherein rst represents the signals transmitted on the reset lines RST, ga represents the signals transmitted on the scan lines GA, and em represents the signals transmitted on the light emitting control lines EM.

In the stage T10, the signals rst control the initialization transistor T6 to be conducted so that the signal transmitted on the initialization line VINIT may be supplied to the gate of the driving transistor T1 so as to reset the gate of the driving transistor T1. The signals rst control the reset transistor T7 to be conducted to supply the signal transmitted on the initialization line VINIT to the anode of the light emitting element 0120 so as to reset the anode of the light emitting element 0120. Moreover, in this stage, the signals ga control both the data writing transistor T2 and the threshold compensation transistor T3 to be turned off. The signals em control both the light emitting control transistor T4 and the conducting control transistor T5 to be turned off.

In the stage T20, the signals ga control the data writing transistor T2 and the threshold compensation transistor T3 to be conducted, and the conducted data writing transistor T2 enables the data signal transmitted on the data line VD to charge the gate of the driving transistor T1 so that a voltage of the gate of the driving transistor T1 is changed to Vdata+Vth, wherein Vth represents a threshold voltage of the driving transistor T1, and Vdata represents a voltage of the data signal. Moreover, in this stage, the signals rst control both the initialization transistor T6 and the reset transistor T7 to be turned off. The signals em control both the light emitting control transistor T4 and the conducting control transistor T5 to be turned off.

In the stage T30, the signals em control both the light emitting control transistor T4 and the conducting control transistor T5 to be conducted. The conducted light emitting control transistor T4 supplies a voltage Vdd of the first power terminal VDD to the first electrode of the driving transistor T1 so that a voltage of the first electrode of the driving transistor T1 is Vdd. The driving transistor T1 generates the driving current according to a gate voltage Vdata+|Vth| and the voltage Vdd of the first electrode. The driving current is supplied to the light emitting element 0120 through the conducted conducting control transistor T5, and drives the light emitting element 0120 to emit light. Moreover, in this stage, the signals rst control the initialization transistor T6 and the reset transistor T7 to be turned off. The signals ga control the data writing transistor T2 and the threshold compensation transistor T3 to be turned off.

It should be noted that in the embodiment of the disclosure, the first electrodes of the transistors above may be sources and the second electrodes of the transistors may be drains; or the first electrodes are drains and the second electrodes are sources, which can be designed and determined according to requirements of practical applications. Moreover, the pixel circuit in each sub-pixel may be a structure including other numbers of transistors in addition to the structure shown in FIGS. 2A and 2B, which is not limited by the embodiment of the disclosure. The structure shown in FIG. 2A is exemplified below.

Exemplarily, the display panel includes the base substrate 10, a transistor array layer disposed on the base substrate 10, a first planarization layer on a side of the transistor array layer facing away from the base substrate 10, a first electrode layer disposed on a side of the first planarization layer facing away from the base substrate 10, a pixel defining layer disposed on a side of the first electrode layer facing away from the base substrate 10, a light emitting layer disposed on a side of the pixel defining layer facing away from the base substrate 10, and a cathode disposed on a side of the light emitting layer facing away from the base substrate 10. The transistor array layer provides the transistors and the capacitors in the pixel circuit, as well as the scan lines, the reset lines, the light emitting control lines EM, the initialization lines VINIT, first power supply signal lines VDD electrically connected to the first power terminal VDD and the like. Exemplarily, the transistor array layer may include an active semiconductor layer 0310, a gate conductive layer 0320, a reference conductive layer 0330, and a source/drain metal layer 0340.

Figure 3:
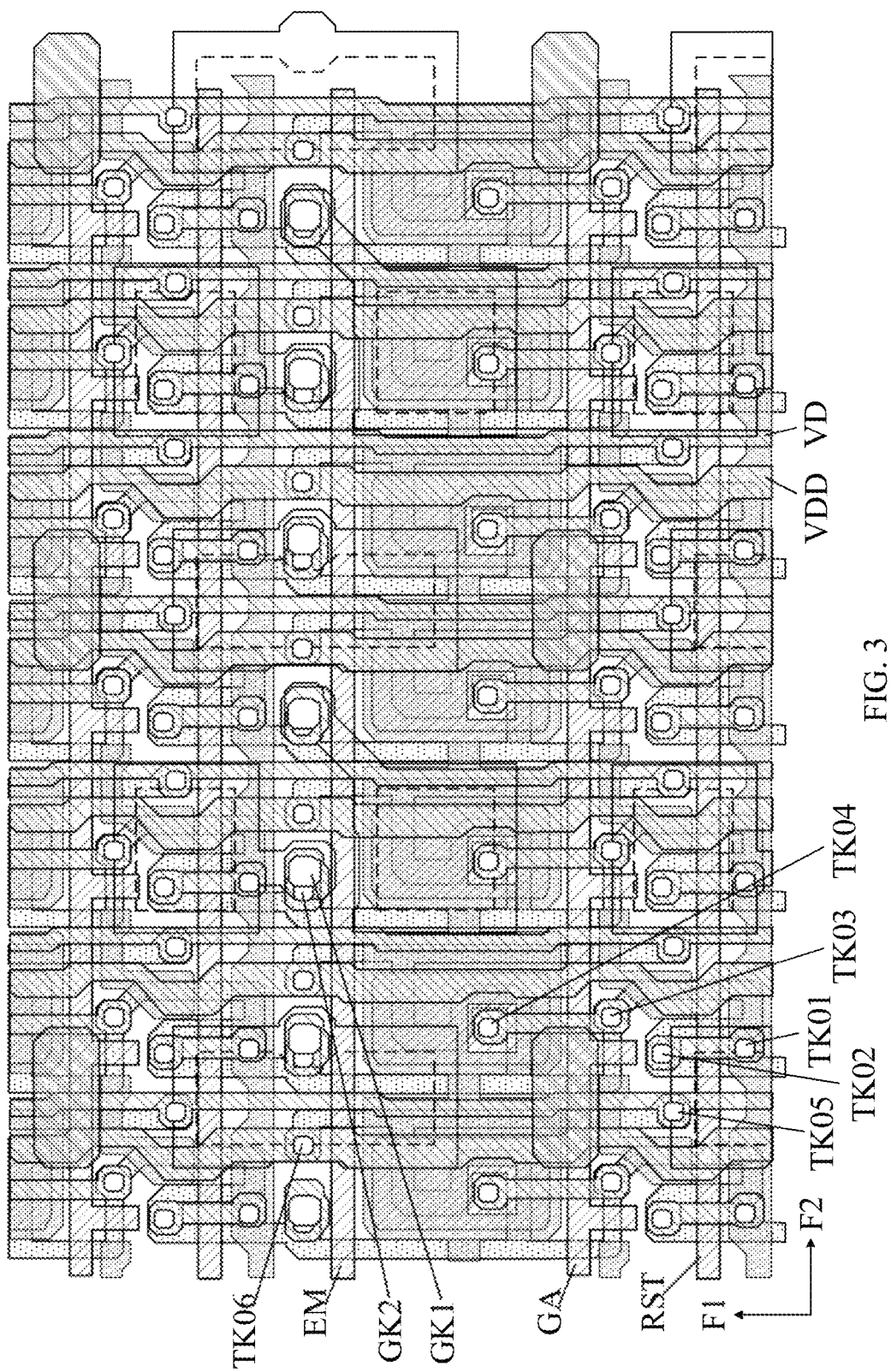
FIG. 3 shows a schematic layout structure diagram of a display panel provided by embodiments of the disclosure.
Figure 4A:
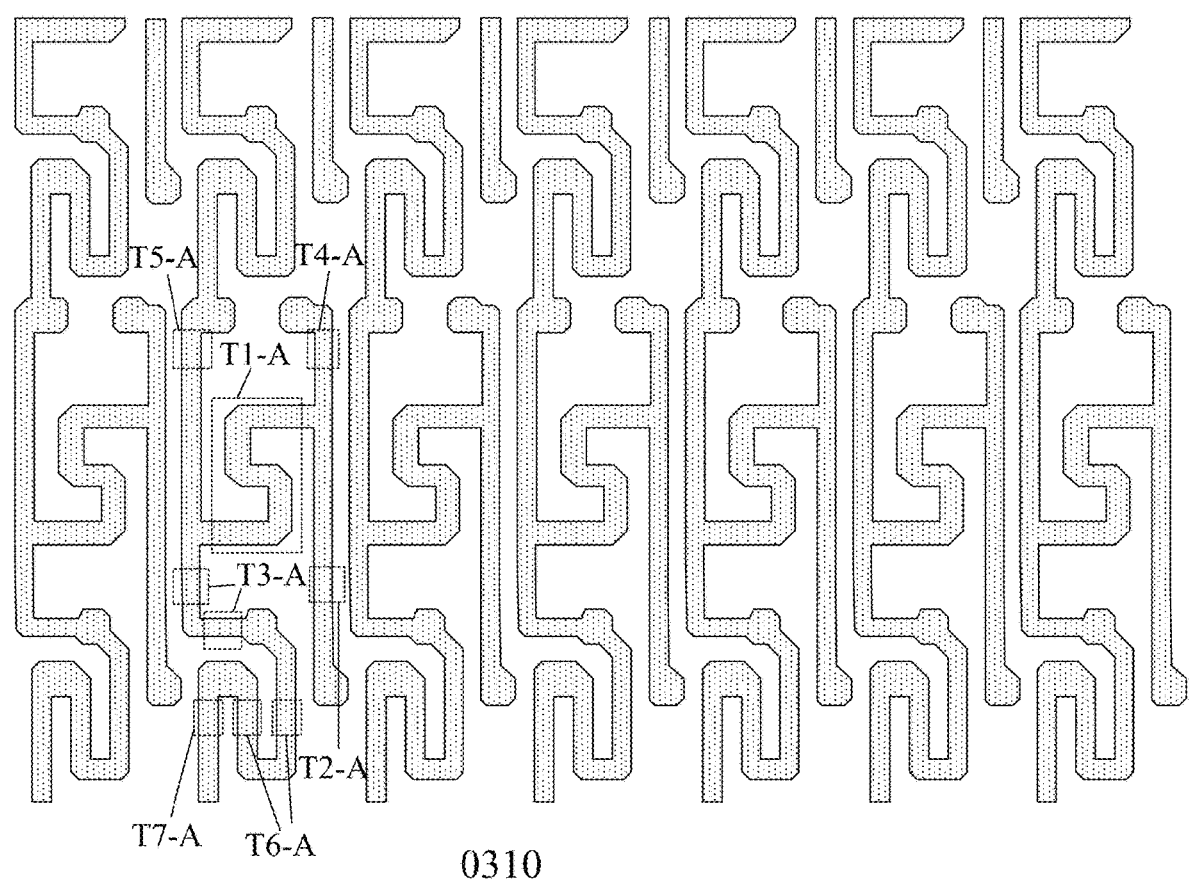
FIG. 4A shows a schematic diagram of some active semiconductor layers provided by embodiments of the disclosure.

Exemplarily, FIGS. 3 and 4A show the active semiconductor layer 0310 of the pixel circuit 0121. The active semiconductor layer 0310 may be formed by patterning a semiconductor material. The active semiconductor layer 0310 may provide driving active layers T1-A of the driving transistors T1, active layers T2-A of the data writing transistors T2, active layers T3-A of the threshold compensation transistors T3, active layers T4-A of the light emitting control transistors T4, active layers T5-A of the conducting control transistors T5, active layers T6-A of the initialization transistors T6 and active layers T7-A of the reset transistors T7. Each active layer may include a source region, a drain region, and a channel region between the source region and the drain region. For example, the active layers of the transistors are integrated.

Exemplarily, the active semiconductor layer 0310 may be made of amorphous silicon, poly-silicon, an oxide semiconductor material, or the like. It should be noted that the source regions and the drain regions described above may be regions doped with n-type materials or p-type materials.

Figure 4B:
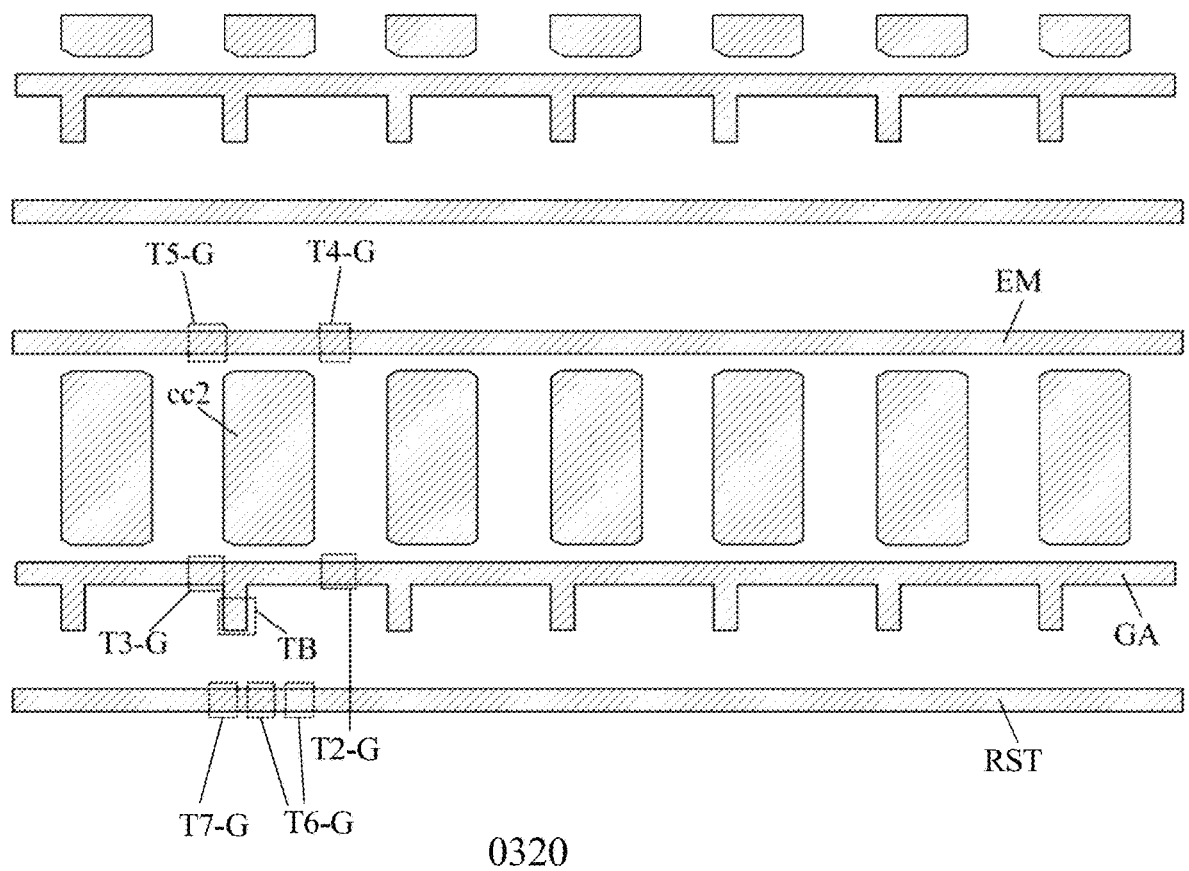
FIG. 4B shows a schematic diagram of some gate conductive layers provided by embodiments of the disclosure.
Figure 5A:
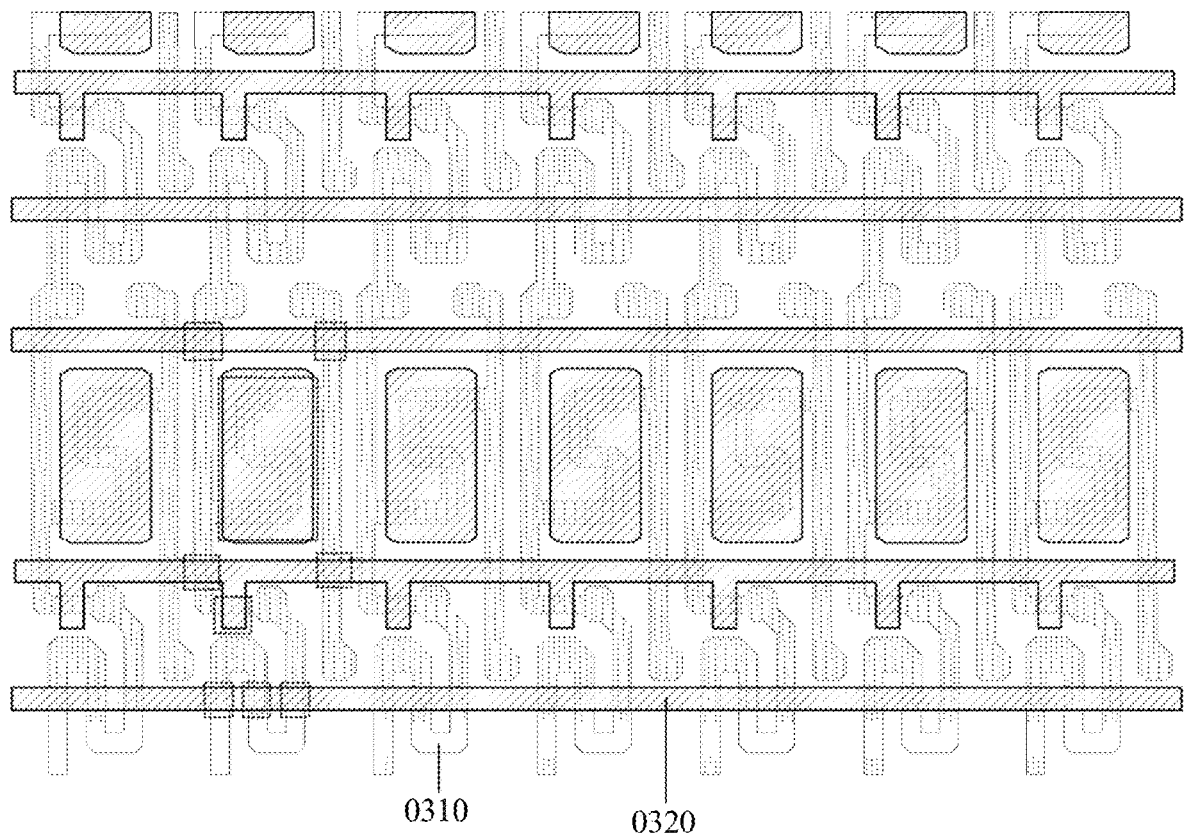
FIG. 5A shows a schematic diagram illustrating laminations of active semiconductor layers and gate conductive layers provided by embodiments of the disclosure.

Exemplarily, the gate insulating layer is formed over the above-mentioned active semiconductor layer 0310 to protect the active semiconductor layer 0310. FIGS. 3, 4B and 5A show the gate conductive layer 0320 of the pixel circuit 0121. The gate conductive layer 0320 is disposed on a side of the gate insulating layer facing away from the base substrate so as to be insulated from the active semiconductor layer 0310. The gate conductive layer 0320 may include second electrodes cc2 of the storage capacitors CST, the scan lines GA, the reset lines RST, the light emitting control lines EM, bulges TB, as well as the gates T2-G of the data writing transistors T2, the gates T3-G of the threshold compensation transistors T3, the gates T4-G of the light emitting control transistors T4, the gates T5-G of the conducting control transistors T5, the gates T6-G of the initialization transistors T6, and the gates T7-G of the reset transistors T7. Bulging parts of the scan lines GA form the bulges TB. One repeating unit corresponds to at least one scan line GA, at least one reset line RST and at least one light emitting control line EM. For example, one repeating unit may correspond to one scan line GA, one reset line RST and one light emitting control line EM.

For example, as shown in FIG. 4B, the gates T2-G of the data writing transistors T2 may be parts where the scan lines GA overlap the active semiconductor layer 0310, the gates T4-G of the light emitting control transistors T4 may be first parts where the light emitting control lines EM overlap the active semiconductor layer 0310, the gates T5-G of the conducting control transistors T5 may be second parts where the light emitting control lines EM overlap the active semiconductor layer 0310, the gates T6-G of the initialization transistors T6 may be first parts where the reset lines RST overlap the active semiconductor layer 0310, the gates T7-G of the reset transistors T7 may be second parts where the reset lines RST overlap the active semiconductor layer 0310, the threshold compensation transistors T3 may be thin film transistors of a double-gate structure, the first gates of the threshold compensation transistors T3 may be parts where the scan lines GA overlap the active semiconductor layer 0310, and the second gates of the threshold compensation transistors T3 may be parts where the bulges TB bulging from the scan lines GA overlap the active semiconductor layer 0310. As shown in FIGS. 3 and 4B, the second electrodes cc2 of the storage capacitors CST serve as the gates of the driving transistors T1.

It should be noted that dashed lines in FIG. 5A show parts, where the active semiconductor layer 0310 and the gate conductive layer 0320 overlap.

Exemplarily, as shown in FIGS. 3 and 4B, the scan lines GA, the reset lines RST, and the light emitting control lines EM are arranged in a first direction F1, and extend substantially in a second direction F2. Exemplarily, an orthographical projection of each scan line GA on the base substrate 10 is located between an orthographical projection of each reset line RST on the base substrate 10 and an orthographical projection of each light emitting control line EM on the base substrate 10. Exemplarily, FIG. 3 is illustrated merely by way of example with the first direction F1 being a column direction and the second direction F2 being a row direction. During specific implementation, the first direction F1 may also be the row direction, and the second direction F2 may also be the column direction, which is not limited here.

Exemplarily, in the first direction F1, the second electrodes cc2 of the storage capacitors CST are located between the scan lines GA and the light emitting control lines EM. Moreover, the bulges TB bulging from the scan lines GA are on sides of the scan lines GA away from the light emitting control lines EM. The bulges TB bulge from the scan lines GA in a direction opposite to the arrow of the first direction F1.

Figure 4C:
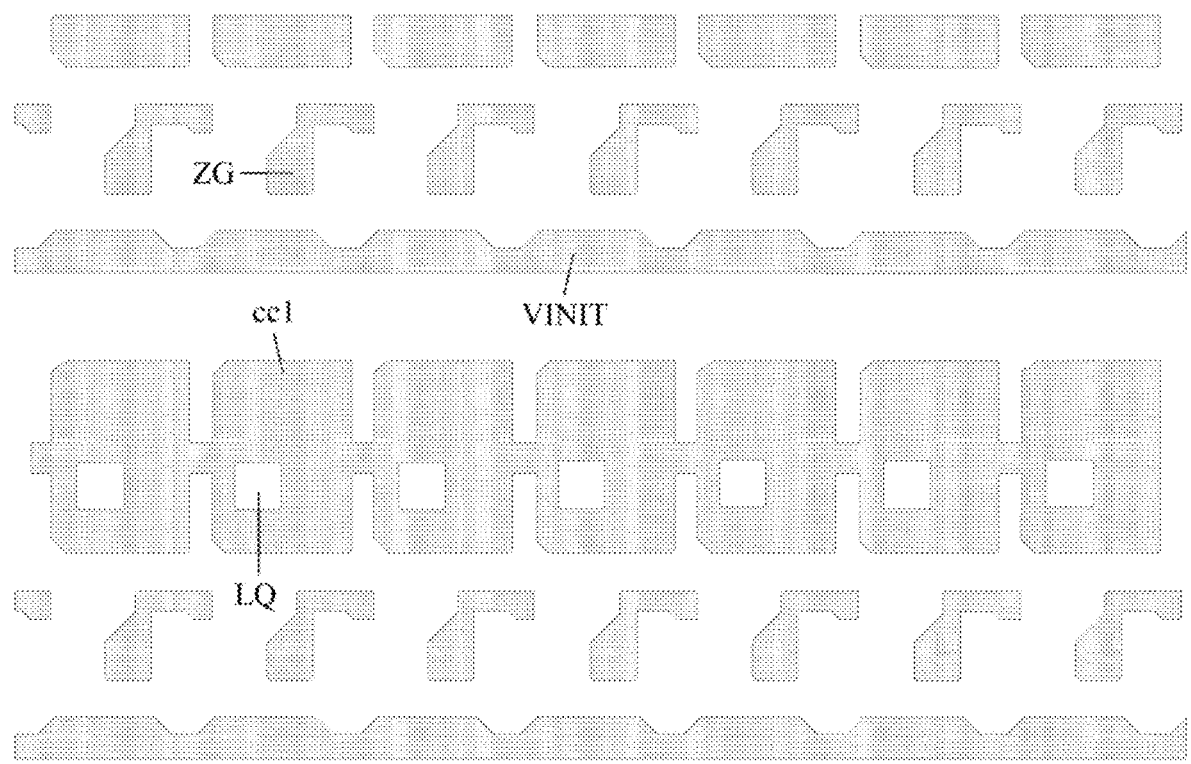
FIG. 4C shows a schematic diagram of some reference conductive layers provided by embodiments of the disclosure.
Figure 5B:
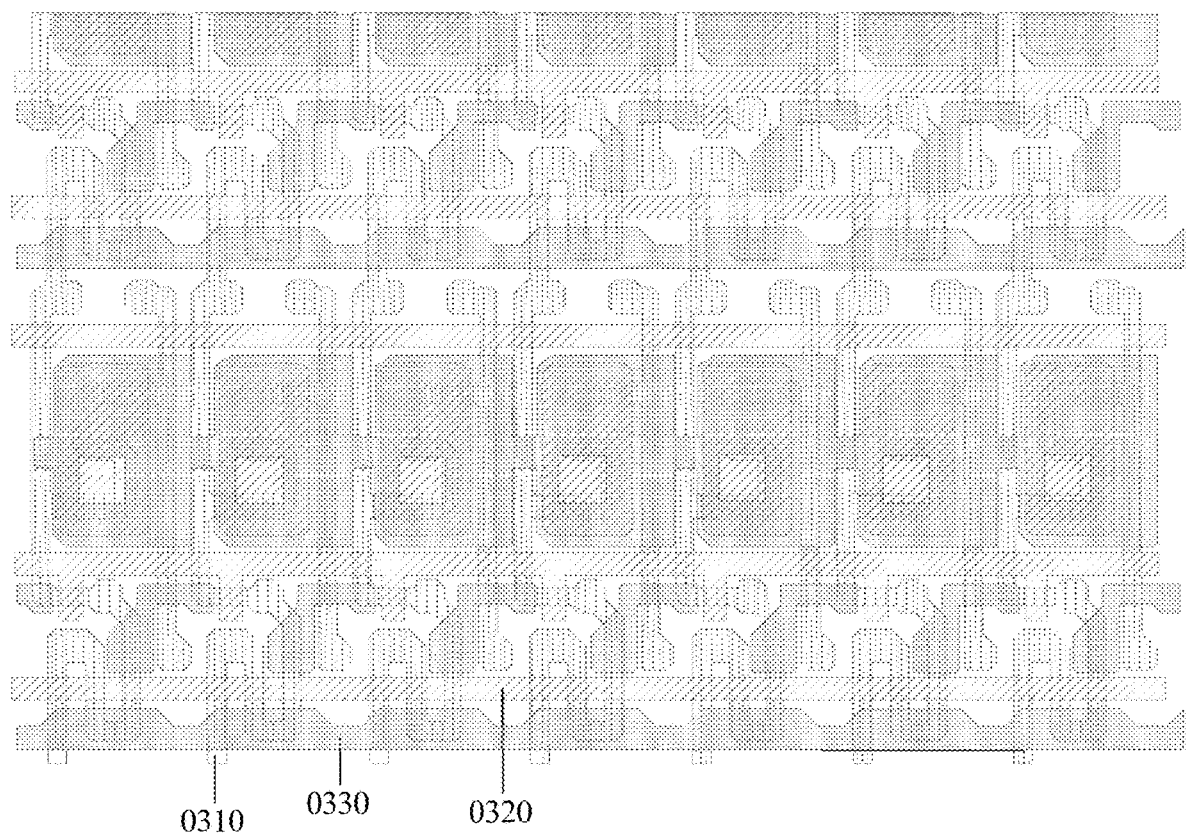
FIG. 5B shows a schematic diagram illustrating laminations of active semiconductor layers, gate conductive layers and reference conductive layers provided by embodiments of the disclosure.

Exemplarily, an interlayer dielectric layer is formed over the gate conductive layer 0320 to protect the gate conductive layer 0320. FIGS. 3, 4C and 5B show the reference conductive layer 0330 of the pixel circuit 120a. The reference conductive layer 0330 includes the first electrodes cc1 of the storage capacitors CST, the initialization lines VINIT, and light shielding layers ZG. The first electrode cc1 and the second electrode cc2 of each storage capacitor CST at least partially overlap to form the storage capacitor CST. Exemplarily, the first electrode cc1 of each storage capacitor CST has a hollowed-out region LQ, and an orthographical projection of each hollowed-out region LQ on the base substrate 10 may have an overlapping area with an orthographical projection of the second electrode cc2 of each storage capacitor CST on the base substrate 10.

Exemplarily, as shown in FIGS. 3, 4C and 5B, an orthographical projection of each light shielding layer ZG on the base substrate 10 overlaps an orthographical projection of the drain region of the corresponding initialization transistor T6 (i.e., a side of the drain region of the initialization transistor T6 electrically connected with the gate of the corresponding driving transistor T1) in the active semiconductor layer 0310 on the base substrate 10. Therefore, the influence of light on the initialization transistors T6 can be reduced, and the reset accuracy may be improved.

Exemplarily, as shown in FIGS. 3, 4C and 5B, each threshold compensation transistor T3 is a double-gate transistor. For example, each light shielding layer ZG shields an active layer portion between the two gates of the corresponding threshold compensation transistor T3, and because the threshold compensation transistors T3 are directly connected to the driving transistors T1, a function of stabilizing an operating state of the driving transistors T1 may be realized.

Figure 4D:
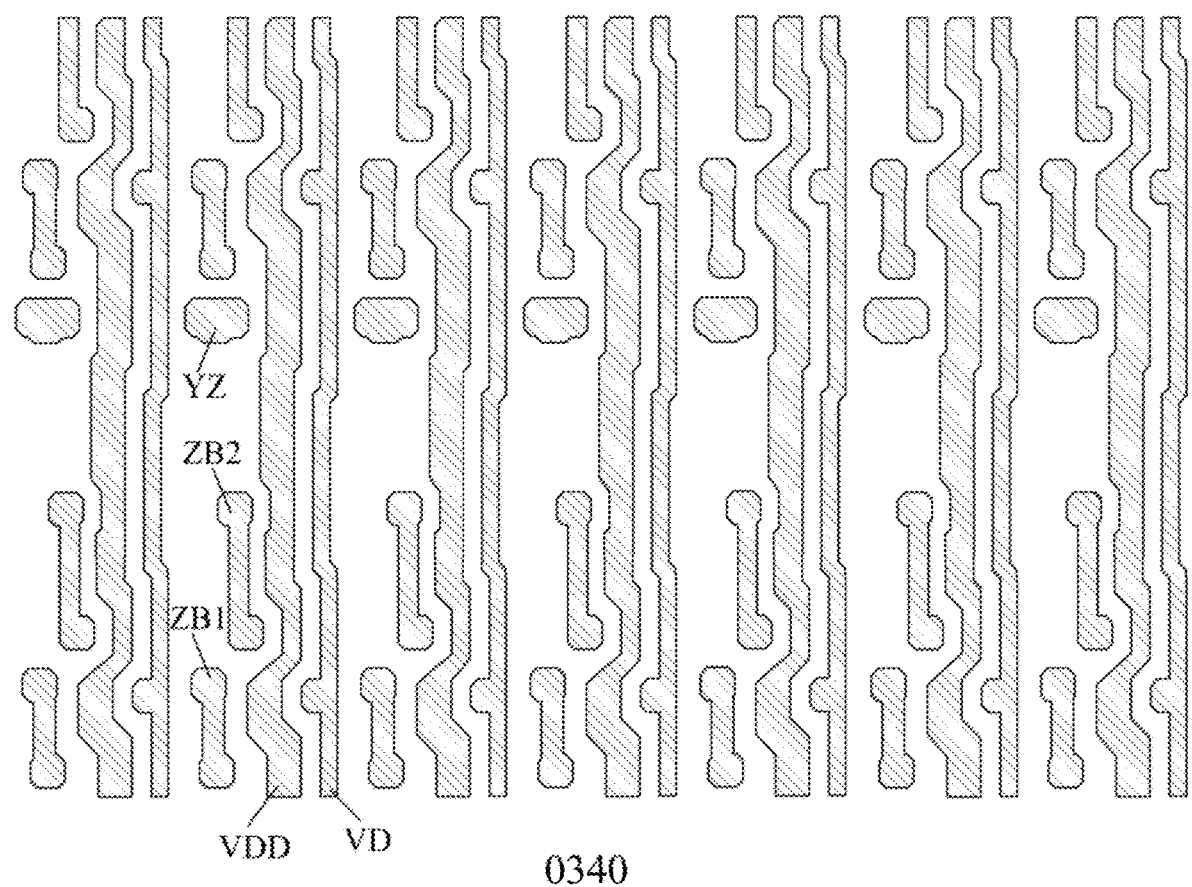
FIG. 4D shows a schematic diagram of some source/drain metal layers provided by embodiments of the disclosure.
Figure 5C:
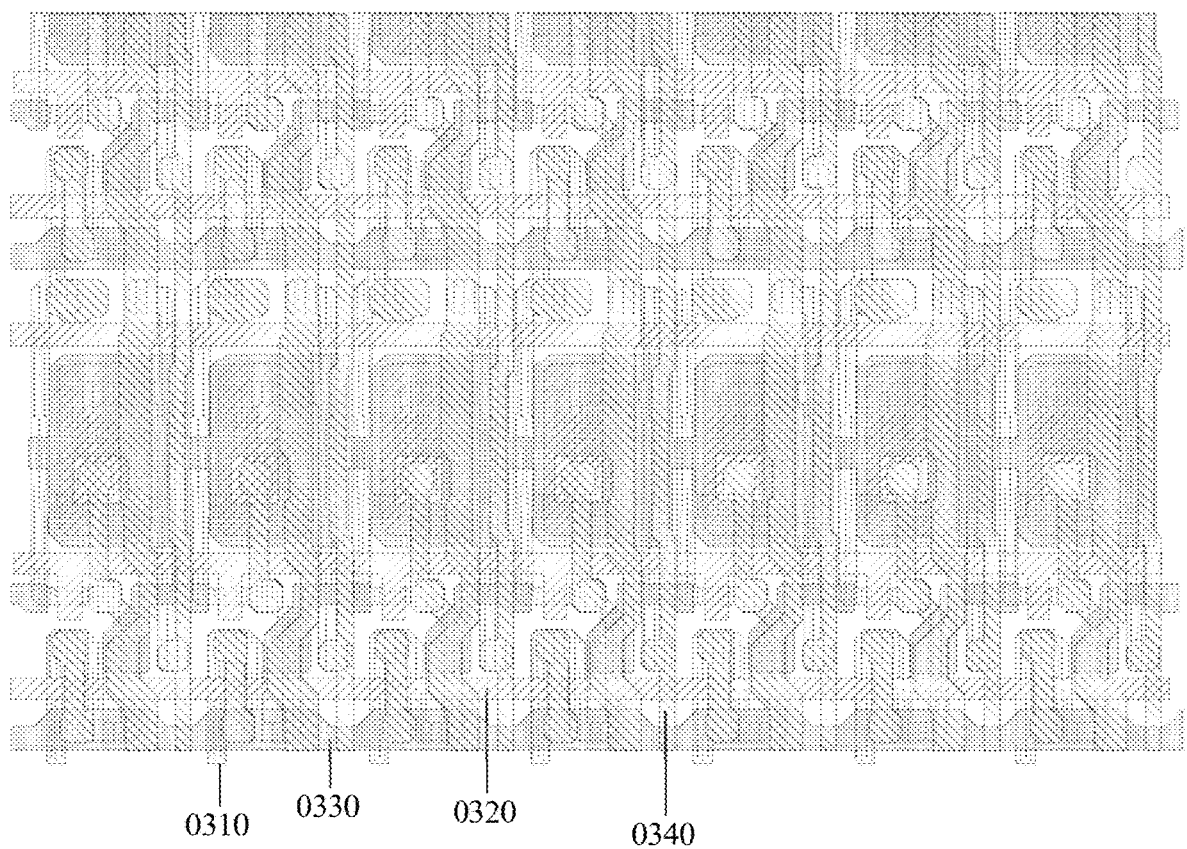
FIG. 5C shows a schematic diagram illustrating laminations of active semiconductor layers, gate conductive layers, reference conductive layers and source/drain metal layers provided by embodiments of the disclosure.

Exemplarily, an interlayer insulating layer is formed over the above-mentioned reference conductive layer 0330 to protect the reference conductive layer 0330. FIGS. 3, 4D and 5C show the source/drain metal layer 0340 of the pixel circuit 0121. The source/drain metal layer 0340 is disposed on a side of the interlayer insulating layer facing away from the base substrate 10. The source/drain metal layer 0340 may include the first power supply signal lines VDD, the data lines VD, first adaptor parts ZB1, second adaptor parts ZB2 and anode adaptor portions YZ. Exemplarily, each sub-pixel spx includes the first adaptor part ZB1, the second adaptor parts ZB2 and the anode adaptor portion YZ.

Exemplarily, as shown in FIGS. 3, 4D and 5C, in the same sub-pixel, the anode adaptor portion YZ is electrically connected with a conductor region of the active layer of the conducting control transistor through a second via hole GK2. The second via hole GK2 runs through the interlayer insulating layer, the interlayer dielectric layer and the gate insulating layer.

Exemplarily, as shown in FIGS. 3, 4D and 5C, first terminals of the first adaptor parts ZB1 are electrically connected with the initialization lines VINIT via through holes TK01, and second terminals of the first adaptor parts ZB1 are electrically connected with the source regions of the initialization transistors T6 in the active semiconductor layer 0310 (e.g., the source regions of the initialization transistors T6 in the active semiconductor layer 0310 and the source regions of the reset transistors T7 are of integrated structures) via through holes TK02. The through holes TK01 run through the interlayer insulating layer. The through holes TK02 run through the interlayer insulating layer, the interlayer dielectric layer and the gate insulating layer.

Exemplarily, as shown in FIGS. 3, 4D and 5C, first terminals of the second adaptor parts ZB2 are electrically connected with the drain regions of the initialization transistors T6 in the active semiconductor layer 0310 (the drain regions of the initialization transistors T6 are electrically connected with the gates of the driving transistors) via through holes TK03, and second terminals of the second adaptor parts ZB2 are electrically connected with the second electrodes cc2 of the storage capacitors CST (i.e., the gates of the driving transistors) via through holes TK04. The through holes TK03 run through the interlayer insulating layer, the interlayer dielectric layer and the gate insulating layer. The through holes TK04 run through the interlayer insulating layer and the interlayer dielectric layer.

Exemplarily, as shown in FIGS. 3, 4D and 5C, the anode adaptor portions YZ are electrically connected with the drain region of the second light emitting control circuit 0124 in the active semiconductor layer 0310 through second via holes GK2. The second via holes GK2 run through the interlayer insulating layer, the interlayer dielectric layer and the gate insulating layer.

Exemplarily, as shown in FIGS. 3, 4D and 5C, the data lines VD are electrically connected with the source regions of the data writing transistors T2 in the active semiconductor layer 0310 via through holes TK05. The through holes TK05 run through the interlayer insulating layer, the interlayer dielectric layer and the gate insulating layer.

Exemplarily, as shown in FIGS. 3, 4D and 5C, the first power supply signal lines VDD are electrically connected with the source regions of the light emitting control transistors T4 in the active semiconductor layer 0310 via through holes TK06. The through holes TK06 run through the interlayer insulating layer, the interlayer dielectric layer and the gate insulating layer.

Exemplarily, as shown in FIGS. 3, 4D and 5C, the first power supply signal lines VDD and the data lines VD are arranged in the second direction F2 and substantially extend in the first direction F1. It needs to be noted that in a practical process, the extension direction of the first power supply signal lines VDD and the data lines VD just needs to substantially meet the above conditions due to limitation of process conditions or other factors, such as the arrangement of lines or via holes, which all fall into the scope of protection of the disclosure.

Exemplarily, an auxiliary insulating layer may further be formed on the source/drain metal layer 0340 to protect the source/drain metal layer 0340. An auxiliary conductive layer may further be formed on a side of the auxiliary insulating layer facing away from the base substrate 10, and thus the auxiliary conductive layer may be electrically connected with the first power supply signal lines VDD to lower resistance of the first power supply signal lines VDD.

Figure 4E:
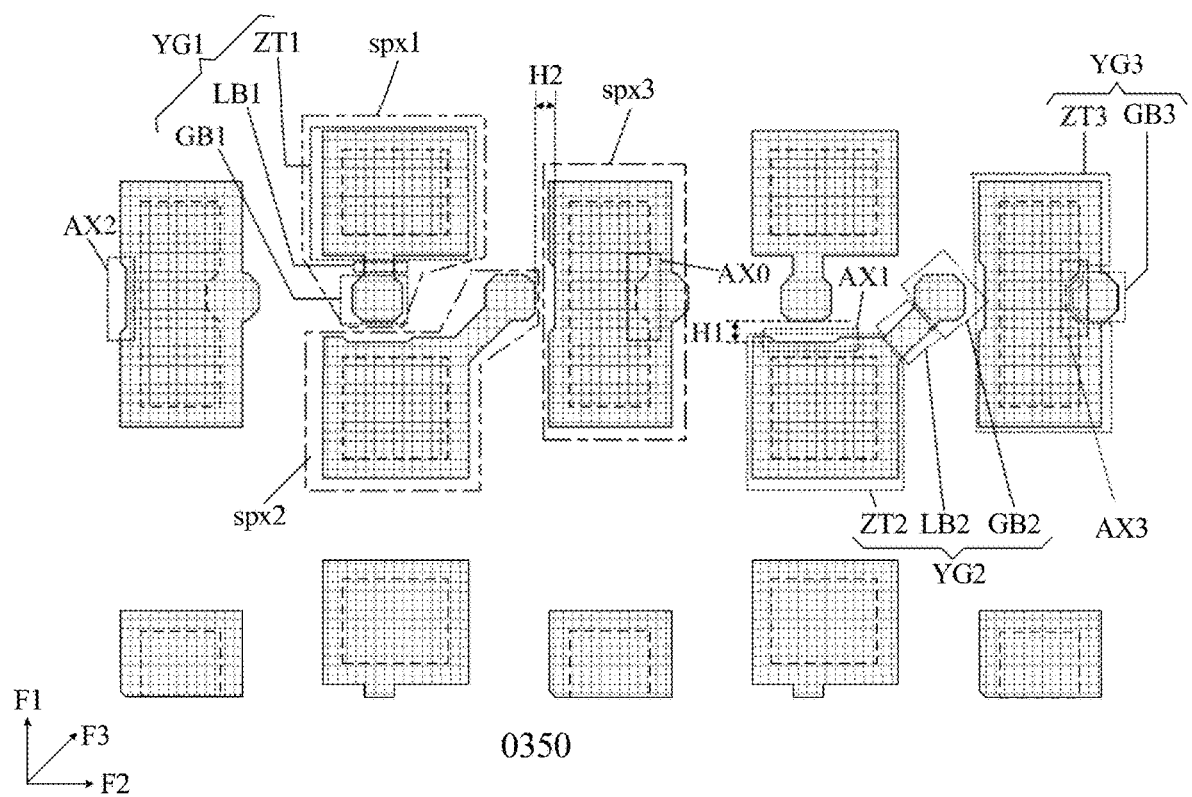
FIG. 4E shows a schematic diagram of some first electrode layers provided by embodiments of the disclosure.
Figure 5D:
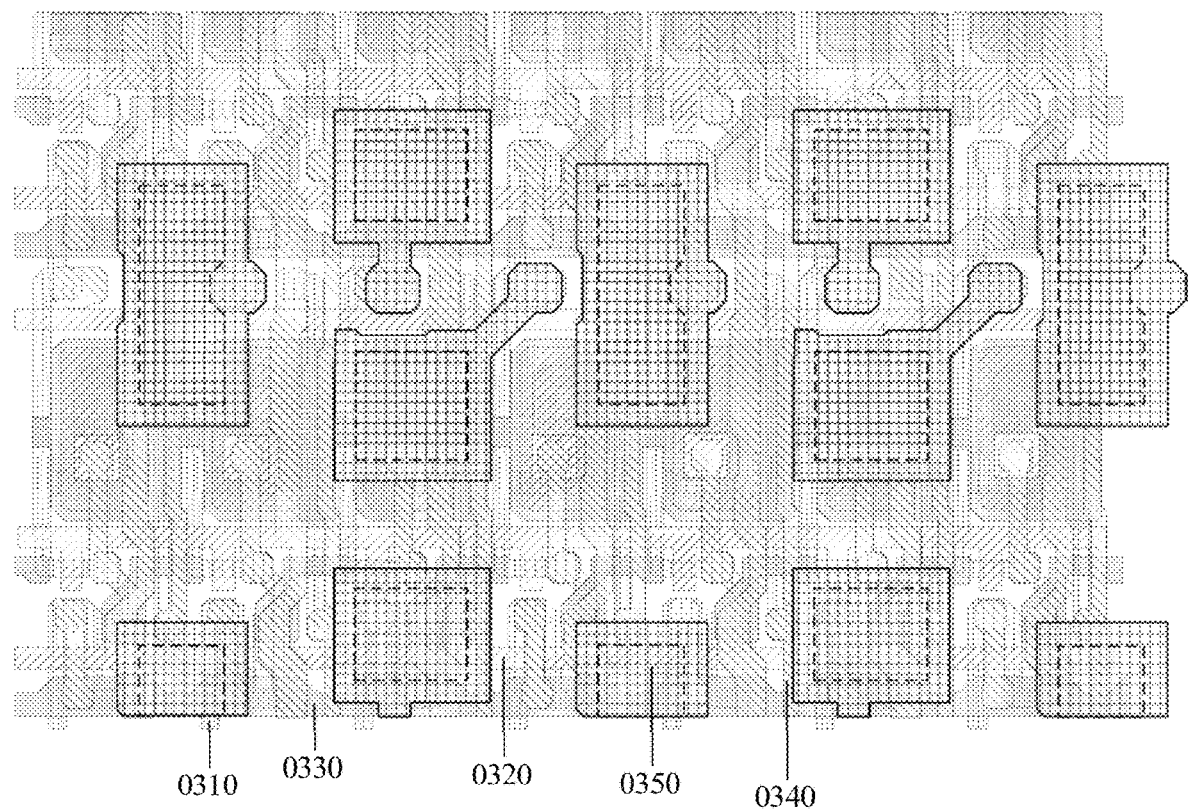
FIG. 5D shows a schematic diagram illustrating laminations of active semiconductor layers, gate conductive layers, reference conductive layers, source/drain metal layers and spacer layers provided by embodiments of the disclosure.

Exemplarily, a first planarization layer is formed on the source/drain metal layer 0340 to protect the source/drain metal layer 0340. Exemplarily, as shown in FIGS. 3, 4E and 5D, a first electrode layer is formed on a side of the first planarization layer facing away from the base substrate 10. The first electrode layer includes anodes located in the sub-pixels. The anodes in the sub-pixels are electrically connected with the anode adaptor portions YZ through first via holes GK1. The first via holes GK1 run through the first planarization layer.

Exemplarily, as shown in FIGS. 1 and 4E, the plurality of sub-pixels include first color sub-pixels spx1 and second color sub-pixels spx2, which are adjacent in the first direction F1. The first color sub-pixels spx1 include anodes YG1, and the second color sub-pixels spx2 include anodes YG2. Orthographical projections of the first via holes GK1 in the first color sub-pixels spx1 on a base substrate 10 are located between orthographical projections of main parts ZT1 in the first color sub-pixels spx1 and main parts ZT2 in the second color sub-pixels on the base substrate 10. Exemplarily, for the first color sub-pixels spx1 and the second color sub-pixels spx2, which are adjacent in the first direction F1, first notches AX1 are provided in sides, facing orthographical projections of the anodes in the first color sub-pixels spx1 on the base substrate 10, of orthographical projections of edges of the anodes in the second color sub-pixels spx2 on the base substrate 10. The first notches AX1 are convex toward centers of the main parts of the second color sub-pixels spx2. Further, the display panel includes a plurality of repeating units PX. Each repeating unit PX includes at least one first color sub-pixel spx1 and at least one second color sub-pixel spx2. For example, each repeating unit PX includes one first color sub-pixel spx1 and one second color sub-pixel spx2 which are adjacent in the first direction F1, and the two adjacent repeating units have two first notches AX1 and two first via holes GK1. In the first direction F1, the two first notches AX1 and the two first via holes GK1 of at least two adjacent repeating units are arranged on a same straight line. For example, the first color sub-pixels spx1 are red sub-pixels, the second color sub-pixels spx2 are green sub-pixels, and then the red sub-pixels and the green sub-pixels are adjacent in the first direction F1. For the red sub-pixels and the green sub-pixels, which are adjacent in the first direction F1, the first notches AX1 are provided in sides, facing orthographical projections of anodes in the red sub-pixels on the base substrate 10, of orthographical projections of anodes in the green sub-pixels on the base substrate 10.

Exemplarily, as shown in FIGS. 1 and 4E, schematic diagrams of layout structures of the pixel circuits included in the sub-pixels are arranged in an array in the first direction and the second direction. That is, the layout structures of the pixel circuits included in the sub-pixels are periodically arranged in a row direction and a column direction. Further, the plurality of repeating units PX are arranged in the second direction F2 to form repeating unit groups PXZ which are arranged in the first direction F1. The repeating units include the first color sub-pixels spx1 and the second color sub-pixels spx2, which are sequentially arranged in the first direction F1. First notches AX1 are disposed in sides, facing orthographical projections of anodes in the first color sub-pixels spx1 on the base substrate 10, of orthographical projections of anodes in the second color sub-pixels spx2 on the base substrate 10. That is, the first notches AX1 are provided on the main parts ZT2 in the second color sub-pixels spx2. For example, the first color sub-pixels spx1 are red sub-pixels, the second color sub-pixels spx2 are green sub-pixels, and in the same repeating unit, the first notch AX1 is disposed in a side, facing the orthographical projection of the anode in the red sub-pixel on the base substrate 10, of the orthographical projection of the anode in the green sub-pixel on the base substrate 10. For example, one repeating unit group PXZ may correspond to one scan line GA, one reset line RST and one light emitting control line EM.

Exemplarily, as shown in FIGS. 1 and 4E, each repeating unit further include at least one third color sub-pixel spx3. For example, each repeating unit may include one third color sub-pixel spx3. Anodes in each first color sub-pixel spx1, each second color sub-pixel spx2 and each third color sub-pixel, which are adjacent to one another, locate at three vertices of a triangle. For example, the first color sub-pixels spx1 are red sub-pixels, the second color sub-pixels spx2 are green sub-pixels, and the third color sub-pixels spx3 are blue sub-pixels. In the same repeating unit, if lines are used to connect the anodes in each red sub-pixel, each green sub-pixel and each blue sub-pixel, the lines form a triangle.

Exemplarily, as shown in FIGS. 3 and 4E, each anode may include a main part and a via hole part, which are electrically connected to each other. An orthographical projection of each via hole part on the base substrate 10 covers an orthographical projection of the corresponding first via hole GK1 on the base substrate 10. In each sub-pixel, the via hole part is electrically connected with the anode adaptor portion YZ through the first via hole GK1. Exemplarily, the anode YG1 in the first color sub-pixel spx1 may further include a first connecting part LB1 electrically connected between the main part ZT1 and the via hole part GB1, that is, the main part ZT1 in the first color sub-pixel spx1 is electrically connected with the via hole part GB1 through the first connecting part LB1. The anode YG2 in the second color sub-pixel spx2 further includes a second connecting part LB2 electrically connected between the main part ZT2 and the via hole part GB2, that is, the main part ZT2 in the second color sub-pixel spx2 is electrically connected with the via hole part GB2 through the second connecting part LB2. The main part ZT3 in the third color sub-pixel spx3 is electrically connected with the via hole part GB3 directly. For example, the first color sub-pixel spx1 is a red sub-pixel, and then the main part in the red sub-pixel is electrically connected with the via hole part through the first connecting part. The second color sub-pixel spx2 is a green sub-pixel, and then the main part in the green sub-pixel is electrically connected with the via hole part through the second connecting part. The third color sub-pixel spx3 is a blue sub-pixel, and then the main part in the blue sub-pixel is electrically connected with the via hole part directly.

Exemplarily, as shown in FIGS. 3 and 4E, the first connecting parts extend in the first direction F1. The second connecting parts extend in a third direction F3. The third direction F3 is different from the first direction F1 and the second direction F2. For example, the third direction F3 respectively has included angles with the first direction F1 and the second direction F2, so that the second connecting parts may extend obliquely upwards.

Exemplarily, as shown in FIGS. 3 and 4E, in the same repeating unit, a second notch AX2 is provided in a side, facing an orthographical projection of the first via hole GK1 in the second color sub-pixel spx2 on the base substrate 10, of an orthographical projection of the main part in the third color sub-pixel spx3 on the base substrate 10. For example, the first color sub-pixel spx1 is a red sub-pixel, the second color sub-pixel spx2 is a green sub-pixel, and the third color sub-pixel spx3 is a blue sub-pixel. In the same repeating unit, the second notch AX2 is provided in a side, facing an orthographical projection of the first via hole GK1 in the green sub-pixel on the base substrate 10, of an orthographical projection of the main part in the blue sub-pixel on the base substrate 10.

Exemplarily, as shown in FIGS. 3 and 4E, in the same repeating unit, an orthographical projection of the first via hole GK1 in the first color sub-pixel spx1 on the base substrate 10 is located between orthographical projections of the anode YG1 in the first color sub-pixel spx1 and the anode YG2 in the second color sub-pixel spx2 on the base substrate 10.

Exemplarily, as shown in FIGS. 3 and 4E, in the same repeating unit, an orthographical projection of the first via hole GK1 in the second color sub-pixel spx2 on the base substrate 10 is located between orthographical projections of the via hole part GB1 in the first color sub-pixel spx1 and the main part ZT3 in the third color sub-pixel spx3 on the base substrate 10. The orthographical projections of the first via hole GK1 in the second color sub-pixel spx2, the via hole part GB1 in the first color sub-pixel spx1 and the main part ZT3 in the third color sub-pixel spx3 on the base substrate 10 are disposed on a same straight line which may be substantially parallel to the first direction F1.

Exemplarily, as shown in FIGS. 3 and 4E, in the same repeating unit, an orthographical projection of the first via hole GK1 in the third color sub-pixel spx3 on the base substrate 10 is disposed on a side, facing away from an orthographical projection of the via hole part GB2 in the second color sub-pixel spx2 on the base substrate 10, of an orthographical projection of the second notch AX2 on the base substrate 10. For example, the second color sub-pixel spx2 is a green sub-pixel, the first color sub-pixel spx1 is a red sub-pixel, and the third color sub-pixel spx3 is a blue sub-pixel. In the same repeating unit, an orthographical projection of the first via hole GK1 in the red sub-pixel on the base substrate 10 is located between orthographical projections of the anode in the red sub-pixel and the anode in the green sub-pixel on the base substrate 10. An orthographical projection of the first via hole GK1 in the green sub-pixel on the base substrate 10 is located between orthographical projections of the via hole part in the red sub-pixel and the main part in the blue sub-pixel on the base substrate 10. An orthographical projection of the first via hole GK1 in the blue sub-pixel on the base substrate 10 is disposed on a side, facing away from an orthographical projection of the via hole part in the green sub-pixel on the base substrate 10, of an orthographical projection of the second notch AX2 on the base substrate 10.

Exemplarily, as shown in FIGS. 3 and 4E, in the same repeating unit, an orthographical projection of the first notch AX1 of the anode in the second color sub-pixel spx2 in the second direction F2 at least has an overlapping area with an orthographical projection of the first via hole GK1 in the first color sub-pixel spx1 in the second direction F2. The first direction F1 and the second direction F2 are different. For example, the first color sub-pixel spx1 is a red sub-pixel, the second color sub-pixel spx2 is a green sub-pixel, and the third color sub-pixel spx3 is a blue sub-pixel. In the same repeating unit, an orthographical projection of the first notch AX1 of the anode in the green sub-pixel in the second direction F2 at least has an overlapping area with an orthographical projection of the first via hole GK1 in the red sub-pixel in the second direction F2. It needs to be noted that the orthographical projections in the second direction F2 refer to line projections of the first notch AX1 of the anode in the green sub-pixel and the first via hole GK1 in the red sub-pixel on a straight line where the second direction F2 is located, and the line projections of the two have overlapping in length. In the present application, orthographical projections in the first or second direction both refer to line projections on straight lines where the first direction or the second direction are located.

Exemplarily, as shown in FIGS. 3 and 4E, in the same repeating unit, an orthographical projection of the second notch AX2 of the main part in the third color sub-pixel spx3 in the first direction F1 at least has an overlapping area with an orthographical projection of the first via hole GK1 in the second color sub-pixel spx2 in the first direction F1. For example, the first color sub-pixel spx1 is a red sub-pixel, the second color sub-pixel spx2 is a green sub-pixel, and the third color sub-pixel spx3 is a blue sub-pixel. In the same repeating unit, an orthographical projection of the second notch AX2 of the main part in the blue sub-pixel in the first direction F1 at least has an overlapping area with an orthographical projection of the first via hole GK1 in the green sub-pixel in the first direction F1.

Exemplarily, as shown in FIGS. 3 and 4E, in the same repeating unit, an orthographical projection of the first notch AX1 of the anode in the second color sub-pixel spx2 in the second direction F2 covers an orthographical projection of the first via hole GK1 in the first color sub-pixel spx1 in the second direction F2. An orthographical projection of the first notch AX1 of the anode in the second color sub-pixel spx2 in the second direction F2 covers an orthographical projection of the via hole part GB1 in the first color sub-pixel spx1 in the second direction F2. For example, the first color sub-pixel spx1 is a red sub-pixel, the second color sub-pixel spx2 is a green sub-pixel, and the third color sub-pixel spx3 is a blue sub-pixel. In the same repeating unit, an orthographical projection of the first notch AX1 of the anode in the green sub-pixel in the second direction F2 covers an orthographical projection of the first via hole GK1 in the red sub-pixel in the second direction F2.

Exemplarily, as shown in FIGS. 3 and 4E, in the same repeating unit, an orthographical projection of the second notch AX2 of the main part ZT3 in the third color sub-pixel spx3 in the first direction F1 covers an orthographical projection of the first via hole GK1 in the second color sub-pixel spx2 in the first direction F1. The first color sub-pixel spx1 is a red sub-pixel, the second color sub-pixel spx2 is a green sub-pixel, and the third color sub-pixel spx3 is a blue sub-pixel. In the same repeating unit, an orthographical projection of the second notch AX2 of the main part in the blue sub-pixel in the first direction F1 covers an orthographical projection of the first via hole GK1 in the green sub-pixel in the first direction F1.

Exemplarily, as shown in FIGS. 3 and 4E, in the same repeating unit, an orthographical projection of the second notch AX2 of the main part ZT3 in the third color sub-pixel spx3 in the first direction F1 covers an orthographical projection of the via hole part GB2 in the second color sub-pixel spx2 in the first direction F1. The first color sub-pixel spx1 is a red sub-pixel, the second color sub-pixel spx2 is a green sub-pixel, and the third color sub-pixel spx3 is a blue sub-pixel. In the same repeating unit, an orthographical projection of the second notch AX2 of the main part in the blue sub-pixel in the first direction F1 covers an orthographical projection of the via hole part GB2 in the green sub-pixel in the first direction F1.

Exemplarily, as shown in FIGS. 3 and 4E, the first notches AX1 are disposed in the main parts ZT2 in the second color sub-pixels spx2. In the same repeating unit, an orthographical projection of the first notch AX1 in the second direction F2 covers an orthographical projection of the via hole part in the first color sub-pixel spx1 in the second direction F2. For example, the second color sub-pixel spx2 is a green sub-pixel, the first color sub-pixel spx1 is a red sub-pixel, and the third color sub-pixel spx3 is a blue sub-pixel. The first notch AX1 is disposed in the main part in the green sub-pixel, and in the same repeating unit, the orthographical projection of the first notch AX1 in the second direction F2 covers an orthographical projection of the via hole part in the red sub-pixel in the second direction F2.

Exemplarily, as shown in FIGS. 3 and 4E, in the same repeating unit, an orthographical projection of the second notch AX2 of the main part ZT3 in the third color sub-pixel spx3 in the first direction F1 covers an orthographical projection of the via hole part GB2 in the second color sub-pixel spx2 in the first direction F1. For example, the second color sub-pixel spx2 is a green sub-pixel, the first color sub-pixel spx1 is a red sub-pixel, and the third color sub-pixel spx3 is a blue sub-pixel. In the same repeating unit, an orthographical projection of the second notch of the main part in the blue sub-pixel in the first direction F1 covers an orthographical projection of the via hole part in the green sub-pixel in the first direction F1.

Exemplarily, as shown in FIGS. 3 and 4E, an edge of the orthographical projection of each first notch AX1 on the base substrate 10 is substantially parallel to an edge of the orthographical projection of the via hole part GB1 in each first color sub-pixel spx1 on the base substrate 10. For example, the second color sub-pixel spx2 is a green sub-pixel, the first color sub-pixel spx1 is a red sub-pixel, and the third color sub-pixel spx3 is a blue sub-pixel. In the same repeating unit, an edge of the orthographical projection of the first notch AX1 on the base substrate 10 is substantially parallel to an edge of the orthographical projection of the via hole part in the red sub-pixel on the base substrate 10. It needs to be noted that in a practical process, due to the limitation of process conditions or other factors such as wiring or via hole arrangement, as long as the above parallel relationship substantially meets the above conditions, the parallel relationship belongs to the scope of protection of the disclosure.

Exemplarily, as shown in FIGS. 3 and 4E, an edge of the orthographical projection of each second notch AX2 on the base substrate 10 is substantially parallel to an edge of the orthographical projection of the main part ZT2 in each second color sub-pixel spx2 on the base substrate 10. For example, the second color sub-pixel spx2 is a green sub-pixel, the first color sub-pixel spx1 is a red sub-pixel, and the third color sub-pixel spx3 is a blue sub-pixel. In the same repeating unit, an edge of the orthographical projection of the second notch AX2 on the base substrate 10 is substantially parallel to an edge of the orthographical projection of the main part in the green sub-pixel on the base substrate 10. It needs to be noted that in a practical process, due to the limitation of process conditions or other factors such as wiring or via hole arrangement, as long as the above parallel relationship substantially meets the above conditions, the parallel relationship belongs to the scope of protection of the disclosure.

Exemplarily, as shown in FIGS. 3 and 4E, a first distance between the edge of the orthographical projection of each first notch AX1 on the base substrate 10 and the edge of the orthographical projection of the via hole part GB1 in each first color sub-pixel spx1 on the base substrate 10 is not less than 2.5 μm. For example, the second color sub-pixel spx2 is a green sub-pixel, the first color sub-pixel spx1 is a red sub-pixel, and the third color sub-pixel spx3 is a blue sub-pixel. The first distance between the edge of the orthographical projection of the first notch AX1 on the base substrate 10 and an edge of the orthographical projection of the via hole part in the red sub-pixel on the base substrate 10 is not less than 2.5 μm. For example, the first distance between the edge of the orthographical projection of the first notch AX1 on the base substrate 10 and the edge of the orthographical projection of the via hole part in the red sub-pixel on the base substrate 10 is 2.5 to 20 μm. For example, the first distance may be 2.5 μm, 3.5 μm, 5.5 μm, 10 μm or 20 μm. In practical applications, by combining preparation processes and equipment precision, when display panels are produced in batches, the first distance may be 3.5 μm. Of course, in practical applications, a value of the first distance may be set according to requirements of the practical applications, which is not limited here.

Exemplarily, as shown in FIGS. 3 and 4E, a second distance between the edge of the orthographical projection of each second notch AX2 on the base substrate 10 and the edge of the orthographical projection of the via hole part GB2 in each second color sub-pixel spx2 on the base substrate 10 is not less than 2.5 μm. For example, a second distance between the edge of the orthographical projection of the second notch AX2 on the base substrate 10 and an edge of the orthographical projection of the via hole part GB2 in the second color sub-pixel spx2 on the base substrate 10 is 2.5 to 20 μm. For example, the second color sub-pixel spx2 is a green sub-pixel, the first color sub-pixel spx1 is a red sub-pixel, and the third color sub-pixel spx3 is a blue sub-pixel. The second distance between the edge of the orthographical projection of the second notch AX2 on the base substrate 10 and the edge of the orthographical projection of the via hole part in the green sub-pixel on the base substrate 10 is not less than 2.5 µm. Further, the second distance is 2.5 to 20 µm, and the second distance may be 2.5 µm, 3.5 µm, 5.5 µm, 10 µm or 20 µm. In practical applications, by combining preparation processes and equipment precision, when display panels are produced in batches, the second distance may be 3.5 µm. Of course, in practical applications, a value of the second distance may be set according to requirements of the practical applications, which is not limited here.

Exemplarily, as shown in FIGS. 3 and 4E, the transistor array layer includes driving transistors located in the sub-pixels. Each first color sub-pixel spx1 is a red sub-pixel, each second color sub-pixel spx2 is a green sub-pixel, and each third color sub-pixel spx3 is a blue sub-pixel. The orthographical projection of the anode in each green sub-pixel on the base substrate 10 has an overlapping area with an orthographical projection of a channel region of the driving transistor in each red sub-pixel on the base substrate 10. The orthographical projection of the anode in each red sub-pixel on the base substrate 10 and an orthographical projection of the channel region of each driving transistor on the base substrate 10 do no overlap. Exemplarily, the orthographical projection of the anode in each red sub-pixel on the base substrate 10 has an overlapping area with an orthographical projection of a pixel circuit in each red sub-pixel on the base substrate 10.

Exemplarily, as shown in FIGS. 1, 3 and 4E, one repeating unit corresponds to one scan line GA, one reset line RST and one light emitting control line EM. Further, one repeating unit group PXZ corresponds to one scan line GA, one reset line RST and one light emitting control line EM, that is, a pixel circuit in one repeating unit group PXZ is electrically connected the same scan line GA, the same reset line RST and the same light emitting control line EM. For the scan line GA, the reset line RST and the light emitting control line EM corresponding to the same repeating unit, an orthographical projection of the scan line GA on the base substrate 10 is located between orthographical projections of the reset line RST and the light emitting control line EM on the base substrate 10. For example, for the scan line GA, the reset line RST and the light emitting control line EM corresponding to the same repeating unit group, an orthographical projection of the scan line GA on the base substrate 10 is located between orthographical projections of the reset line RST and the light emitting control line EM on the base substrate 10.

Exemplarily, as shown in FIGS. 1, 3 and 4E, in one repeating unit, an orthographical projection of the reset line RST on the base substrate 10 and an orthographical projection of the anode in the red sub-pixel controlled by the reset line RST on the base substrate 10 do not overlap. An orthographical projection of the light emitting control line EM on the base substrate 10 and an orthographical projection of the anode in the green sub-pixel controlled by the light emitting control line EM on the base substrate 10 have an overlapping area. An orthographical projection of the scan line GA on the base substrate 10 and an orthographical projection of each anode controlled by the scan line GA on the base substrate 10 do not overlap. Further, in one repeating unit group PXZ, an orthographical projection of the reset line RST on the base substrate 10 and an orthographical projection of the anode in the red sub-pixel controlled by the reset line RST on the base substrate 10 do not overlap. An orthographical projection of the light emitting control line EM on the base substrate 10 and an orthographical projection of the anode in the green sub-pixel controlled by the light emitting control line EM on the base substrate 10 have an overlapping area. An orthographical projection of the scan line GA on the base substrate 10 and an orthographical projection of each anode controlled by the scan line GA on the base substrate 10 do not overlap. Further, for one repeating unit, an orthographical projection of the light emitting control line EM controlling the repeating unit on the base substrate 10 respectively has overlapping areas with orthographical projections of the anode in the blue sub-pixel and the anode in the green sub-pixel on the base substrate 10. Orthographical projections of the reset line RST and the scan line GA controlling the repeating unit on the base substrate 10 and orthographical projections of the anodes on the base substrate 10 do not overlap. It needs to be noted that the reset line RST is a signal line controlling the initialization transistor T6 and the reset transistor T7 in one repeating unit. The light emitting control line EM is a signal line controlling the light emitting control transistor T4 and the conducting control transistor T5 in one repeating unit. The scan line GA is a signal line controlling the data writing transistor T2 and the threshold compensation transistor T3 in one repeating unit. For example, for one repeating unit group PXZ, an orthographical projection of the light emitting control line EM controlling the repeating unit group PXZ on the base substrate 10 respectively has overlapping areas with orthographical projections of the anode in the blue sub-pixel and the anode in the green sub-pixel on the base substrate 10. Orthographical projections of the reset line RST and the scan line GA controlling the repeating unit group PXZ on the base substrate 10 and orthographical projections of the anodes on the base substrate 10 do not overlap. It needs to be noted that the reset line RST is a signal line controlling the initialization transistor T6 and the reset transistor T7 in one repeating unit group. The light emitting control line EM is a signal line controlling the light emitting control transistor T4 and the conducting control transistor T5 in one repeating unit group. The scan line GA is a signal line controlling the data writing transistor T2 and the threshold compensation transistor T3 in one repeating unit group.

Exemplarily, as shown in FIGS. 1, 3 and 4E, an orthographical projection of each reset line on the base substrate 10 has an overlapping area with an orthographical projection of the anode in each red sub-pixel on the base substrate 10. An orthographical projection of each light emitting control line on the base substrate 10 has an overlapping area with an orthographical projection of the anode in each green sub-pixel on the base substrate 10. An orthographical projection of each scan line on the base substrate 10 and an orthographical projection of each anode on the base substrate 10 do not overlap.

Exemplarily, as shown in FIGS. 3 and 4E, in the same repeating unit, the orthographical projection of the anode in the third color sub-pixel spx3 on the base substrate 10 respectively has overlapping areas with orthographical projections of the reset line controlling the pixel circuit in the third color sub-pixel spx3 and the light emitting control line on the base substrate 10. For example, the first color sub-pixel spx1 is a red sub-pixel, the second color sub-pixel spx2 is a green sub-pixel, and the third color sub-pixel spx3 is a blue sub-pixel. In the same repeating unit, the orthographical projection of the anode in the blue sub-pixel on the base substrate 10 respectively has overlapping areas with orthographical projections of the reset line and the light emitting control line on the base substrate 10.

Exemplarily, as shown in FIGS. 3 and 4E, orthographical projections of the first via hole GK1 and the second via hole GK2 in each red sub-pixel on the base substrate 10 have a first overlapping area. Orthographical projections of the first via hole GK1 and the second via hole GK2 in each green sub-pixel on the base substrate 10 have a second overlapping area. Orthographical projections of the first via hole GK1 and the second via hole GK2 in each blue sub-pixel on the base substrate 10 have a third overlapping area. The area of the first overlapping area is not greater than the area of the second overlapping area, and is not greater than the area of the third overlapping area. Further, the area of the third overlapping area may be made smaller than or substantially equal to the area of the second overlapping area. It needs to be noted that in a practical process, due to the limitation of process conditions or other factors such as wiring or via hole arrangement, as long as the above equality relationship substantially meets the above conditions, the equality relationship belongs to the scope of protection of the disclosure.

Exemplarily, the area of the first overlapping area is 0 to 0.9 $\mu m^2$. For example, the area of the first overlapping area may also be 0.5 $\mu m^2$ or 0.9 $\mu m^2$. Or, the area of the first overlapping area may be 0, so that the orthographical projections of the first via hole GK1 and the second via hole GK2 in each red sub-pixel on the base substrate 10 do not overlap.

Exemplarily, the area of the second overlapping area is 0 to 0.9 $\mu m^2$. For example, the area of the second overlapping area may also be 0.5 $\mu m^2$ or 0.9 $\mu m^2$. Or, the area of the second overlapping area may be 0, so that the orthographical projections of the first via hole GK1 and the second via hole GK2 in each green sub-pixel on the base substrate 10 do not overlap.

Exemplarily, the area of the third overlapping area is 0 to 0.9 $\mu m^2$. For example, the area of the third overlapping area may also be 0.5 $\mu m^2$ or 0.9 $\mu m^2$. Or, the area of the third overlapping area may be 0, so that the orthographical projections of the first via hole GK1 and the third via hole GK2 in each blue sub-pixel on the base substrate 10 do not overlap.

Exemplarily, when each first color sub-pixel spx1 is a red sub-pixel, each second color sub-pixel spx2 is a green sub-pixel and each third color sub-pixel spx3 is a blue sub-pixel, each second overlapping area may be set larger to guarantee the distance between the anodes in the blue sub-pixel and the green sub-pixel, so as to avoid color mixing.

Exemplarily, as shown in FIGS. 3 and 4E, the first via holes GK1 in the repeating units adjacent in the second direction F2 are substantially arranged in sequence in the second direction F2. For example, the first via holes GK1 in each repeating unit group are substantially arranged in sequence in the second direction F2. Exemplarily, the orthographical projections, in the first direction F1, of the first via holes GK1 in the repeating units adjacent in the second direction F2 overlap. For example, the orthographical projections, in the first direction F1, of the first via holes GK1 in each repeating unit group overlap. It needs to be noted that in a practical process, due to the limitation of process conditions or other factors such as wiring or via hole arrangement, as long as the arrangement relationship of the first via holes GK1 substantially meets the above conditions, the arrangement relationship belongs to the scope of protection of the disclosure.

Figure 4F:
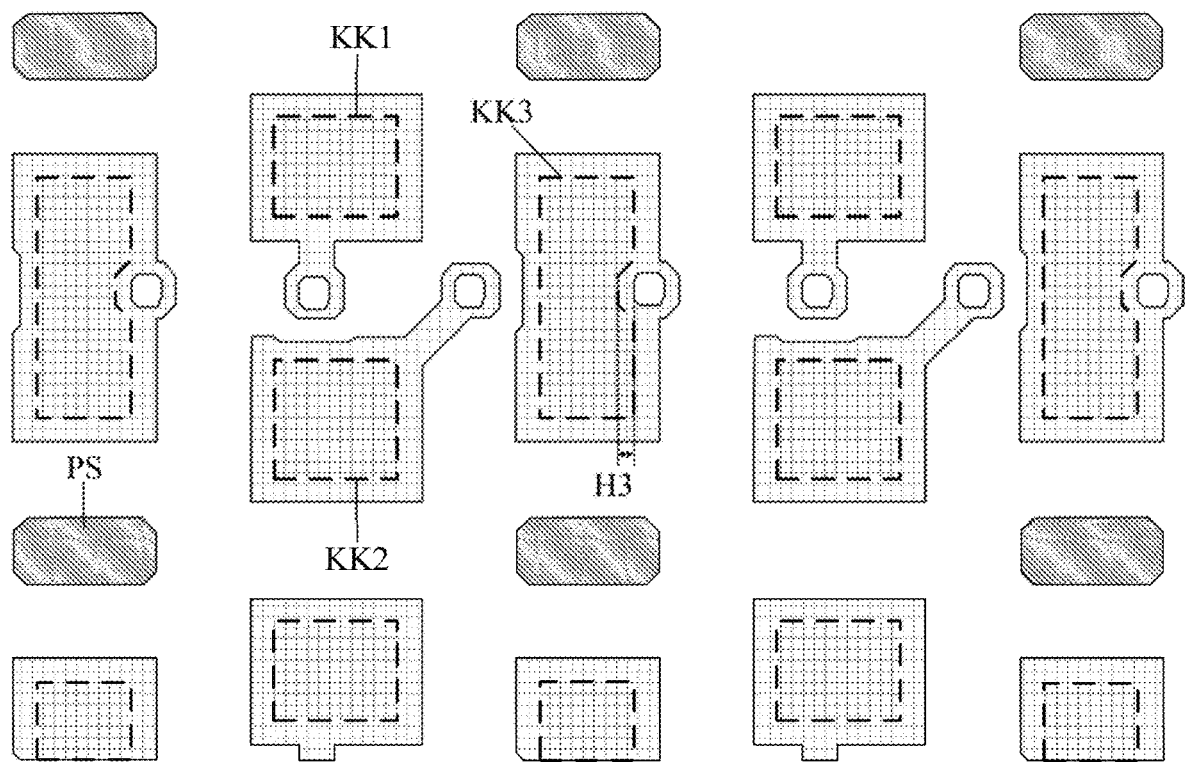
FIG. 4F shows a schematic diagram of some first electrode layers and spacer layers provided by embodiments of the disclosure.

Exemplarily, as shown in FIGS. 3, 4E and 4F, the pixel defining layer is formed on a side of the first electrode layer facing away from the base substrate 10. The pixel defining layer includes openings located in the sub-pixels, and in the same sub-pixel, an orthographical projection of the opening on the base substrate 10 is located in an orthographical projection of the anode on the base substrate 10. For example, each first color sub-pixel spx1 is a red sub-pixel, each second color sub-pixel spx2 is a green sub-pixel, each third color sub-pixel spx3 is a blue sub-pixel, the red sub-pixel has an opening KK1, the green sub-pixel has an opening KK2, and the blue sub-pixel has an opening KK3. It needs to be noted that regions where the openings in the sub-pixels are located are equivalent to light emitting regions.

Exemplarily, as shown in FIGS. 3, 4E and 4F, in at least one of each first color sub-pixel spx1 and each second color sub-pixel spx2, the orthographical projection of the opening on the base substrate 10 is rectangular. For example, the orthographical projections of the openings in each first color sub-pixel spx1 and each second color sub-pixel spx2 on the base substrate 10 are both rectangular. For example, each first color sub-pixel spx1 is a red sub-pixel, each second color sub-pixel spx2 is a green sub-pixel, each third color sub-pixel spx3 is a blue sub-pixel, and the orthographical projections of the opening KK1 in the red sub-pixel and the opening KK2 in the green sub-pixel on the base substrate 10 are both rectangular.

Exemplarily, as shown in FIGS. 3, 4E and 4F, the area of the opening in each third color sub-pixel spx3 is greater than the area of the opening in each second color sub-pixel spx2, and the area of the opening in each second color sub-pixel spx2 is greater than the area of the opening in each first color sub-pixel spx1. For example, each first color sub-pixel spx1 is a red sub-pixel, each second color sub-pixel spx2 is a green sub-pixel, each third color sub-pixel spx3 is a blue sub-pixel, the area of the opening KK3 in the blue sub-pixel is greater than the area of the opening KK2 in the green sub-pixel, and the area of the opening KK2 in the green sub-pixel is greater than the area of the opening KK1 in the red sub-pixel. In practical applications, the areas of the openings in the sub-pixels may be inversely proportional to light emitting lives of the sub-pixels. For example, the light emitting lives of the red sub-pixels are longer than the light emitting lives of the green sub-pixels and the light emitting lives of the green sub-pixels are longer than the light emitting lives of the blue sub-pixels, so that the area of the openings in the blue sub-pixels may be greater than that of the openings in the green sub-pixels, and the area of the openings in the green sub-pixels may be greater than that of the openings in the red sub-pixels.

Exemplarily, as shown in FIGS. 3, 4E and 4F, in each third color sub-pixel spx3, an opening notch AX0 is formed in a side, facing the orthographical projection of the first via hole GK1 in the third color sub-pixel spx3 on the base substrate 10, of the orthographical projection of the opening on the base substrate 10. For example, each first color sub-pixel spx1 is a red sub-pixel, each second color sub-pixel spx2 is a green sub-pixel, and each third color sub-pixel spx3 is a blue sub-pixel. In the blue sub-pixel, the opening notch AX0 is formed in the side, facing the orthographical projection of the first via hole GK1 on the base substrate 10, of the orthographical projection of the opening KK3 on the base substrate 10. The area of the opening notch AX0 may be set to be the area required by fan-out of the first via hole GK1, so that it may be guaranteed that the anode in the opening KK3 has high flatness, which improves the display effect.

Exemplarily, as shown in FIGS. 3, 4E and 4F, in each third color sub-pixel spx3, an orthographical projection of the opening notch AX0 in the first direction F1 covers an orthographical projection of the first via hole GK1 in the first direction F1. For example, each first color sub-pixel spx1 is a red sub-pixel, each second color sub-pixel spx2 is a green sub-pixel, and each third color sub-pixel spx3 is a blue sub-pixel. In the blue sub-pixel, the orthographical projection of the opening notch AX0 in the first direction F1 covers the orthographical projection of the first via hole GK1 in the first direction F1.

Exemplarily, as shown in FIGS. 3, 4E and 4F, in each third color sub-pixel spx3, an edge of an orthographical projection of the opening notch AX0 on the base substrate 10 is substantially parallel to an edge of an orthographical projection of the first via hole GK1 on the base substrate 10. For example, each first color sub-pixel spx1 is a red sub-pixel, each second color sub-pixel spx2 is a green sub-pixel, and each third color sub-pixel spx3 is a blue sub-pixel.

In the blue sub-pixel, the edge of the orthographical projection of the opening notch AX0 on the base substrate 10 is substantially parallel to the edge of the orthographical projection of the first via hole GK1 on the base substrate 10. It needs to be noted that in a practical process, due to the limitation of process conditions or other factors such as wiring or via hole arrangement, as long as the above parallel relationship substantially meets the above conditions, the parallel relationship belongs to the scope of protection of the disclosure.

Exemplarily, as shown in FIGS. 3, 4E and 4F, in each third color sub-pixel spx3, a third distance between the edge of the orthographical projection of the opening notch AX0 on the base substrate 10 and the edge of the orthographical projection of the first via hole GK1 on the base substrate 10 is not less than 2.25 μm. Further, the third distance is 2.25 to 20 μm. For example, each first color sub-pixel spx1 is a red sub-pixel, each second color sub-pixel spx2 is a green sub-pixel, and each third color sub-pixel spx3 is a blue sub-pixel. In the blue sub-pixel, the third distance between the edge of the orthographical projection of the opening notch AX0 on the base substrate 10 and the edge of the orthographical projection of the first via hole GK1 on the base substrate 10 is not less than 2.25 μm. Exemplarily, the third distance may be 2.25 μm, 2.5 μm or 20 μm. In practical applications, by combining preparation processes and equipment precision, when display panels are produced in batches, the third distance may be 2.5 μm. Of course, in practical applications, a value of the third distance may be set according to requirements of the practical applications, which is not limited here.

Exemplarily, as shown in FIGS. 3, 4E and 4F, in each third color sub-pixel spx3, a third notch AX3 is formed in a side, facing an orthographical projection of the first via hole GK1 of the anode YG3 in the third color sub-pixel spx3 on the base substrate 10, of an orthographical projection of the main part ZT3 of the anode YG3 on the base substrate 10, and the third notch AX3 is substantially parallel to the opening notch AX0. For example, each first color sub-pixel spx1 is a red sub-pixel, each second color sub-pixel spx2 is a green sub-pixel, and each third color sub-pixel spx3 is a blue sub-pixel. In the blue sub-pixel, the third notch AX3 is formed in the side, facing the orthographical projection of the first via hole GK1 of the anode YG3 in the third color sub-pixel spx3 on the base substrate 10, of the orthographical projection of the main part ZT3 of the anode YG3 on the base substrate 10, and the third notch AX3 is substantially parallel to the opening notch AX0.

Exemplarily, as shown in FIGS. 3, 4E and 4F, in each third color sub-pixel spx3, an edge of an orthographical projection of the third notch AX3 on the base substrate 10 and an edge of an orthographical projection of the opening notch AX0 on the base substrate 10 overlap. For example, each first color sub-pixel spx1 is a red sub-pixel, each second color sub-pixel spx2 is a green sub-pixel, and each third color sub-pixel spx3 is a blue sub-pixel. In the blue sub-pixel, the edge of the orthographical projection of the third notch AX3 on the base substrate 10 and the edge of the orthographical projection of the opening notch AX0 on the base substrate 10 overlap.

Exemplarily, as shown in FIGS. 3, 4E and 4F, a spacer layer is formed on a side of the pixel defining layer facing away from the base substrate 10. The spacer layer includes a plurality of spacers PS disposed at intervals. One spacer PS is disposed between the anodes in the third color sub-pixels adjacent in the first direction F1.

It needs to be noted that the above via holes and through holes may be circular, square, octagonal and the like, which may be designed according to requirements of practical applications and not limited here.

Figure 6:
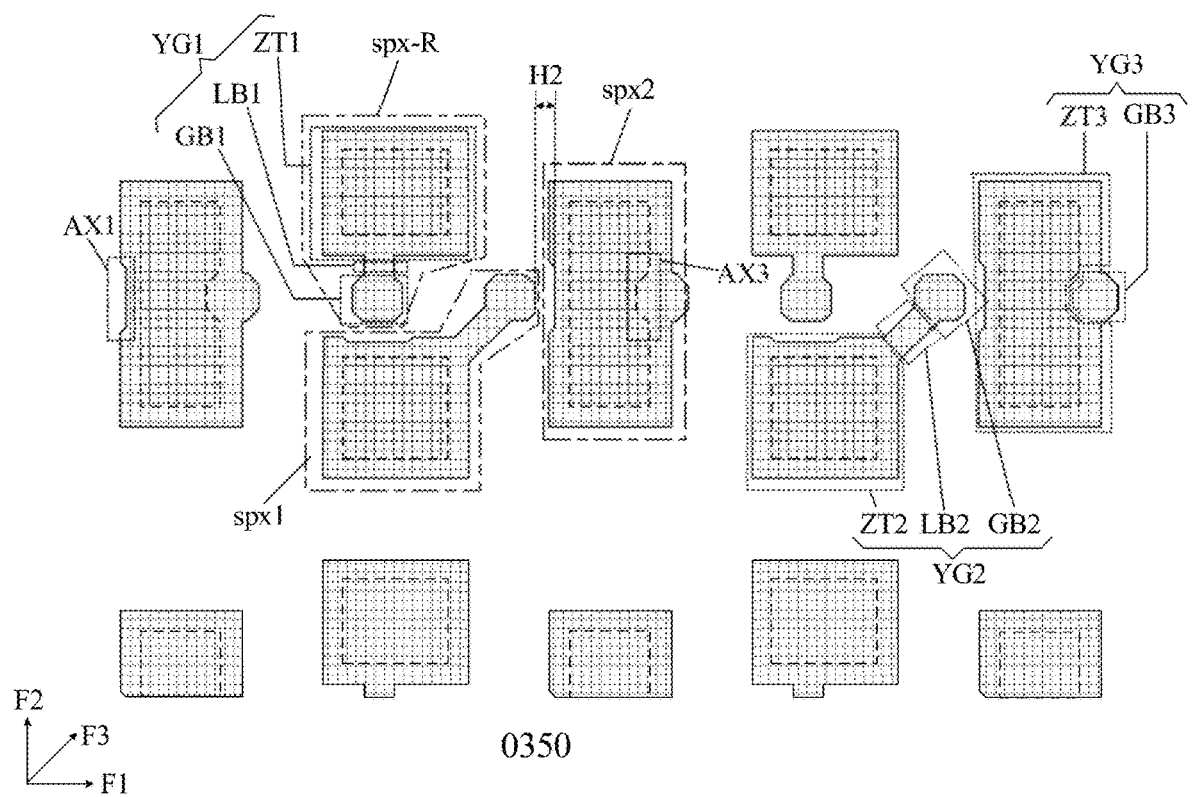
FIG. 6 shows a schematic diagram of other first electrode layers provided by embodiments of the disclosure.

In some embodiments, as shown in FIG. 6, each first color sub-pixel spx1 may also be a green sub-pixel, and each second color sub-pixel spx2 may also be a blue sub-pixel. At this point, the first direction F1 may be a row direction of each sub-pixel, and the second direction F2 may be a column direction of each sub-pixel. Each repeating unit includes green sub-pixels and blue sub-pixels arranged in sequence in the first direction F1, and may also include red sub-pixels, where the red sub-pixels and the green sub-pixels are arranged in the second direction F2. First notches AX1 are provided in sides, facing orthographical projections of the anodes in the green sub-pixels on the base substrate 10, of orthographical projections of the anodes in the blue sub-pixels on the base substrate 10.

In some embodiments, when the first color sub-pixels spx1 are green sub-pixels and the second color sub-pixels spx2 are blue sub-pixels, as shown in FIG. 6, in the same repeating unit, an orthographical projection of the first via hole GK1 in the green sub-pixel on the base substrate 10 is located between orthographical projections of the anode in the green sub-pixel and the anode in the blue sub-pixel on the base substrate 10.

In some embodiments, when the first color sub-pixels spx1 are green sub-pixels and the second color sub-pixels spx2 are blue sub-pixels, as shown in FIG. 6, in the same repeating unit, an orthographical projection of the first notch AX1 of the anode in the blue sub-pixel in the second direction F2 at least has an overlapping area with an orthographical projection of the first via hole GK1 in the green sub-pixel in the second direction F2.

In some embodiments, when the first color sub-pixels spx1 are green sub-pixels and the second color sub-pixels spx2 are blue sub-pixels, as shown in FIG. 6, in the same repeating unit, the orthographical projection of the first notch AX1 of the anode in the blue sub-pixel in the second direction F2 covers the orthographical projection of the first via hole GK1 in the green sub-pixel in the second direction F2.

In some embodiments, when the first color sub-pixels spx1 are green sub-pixels and the second color sub-pixels spx2 are blue sub-pixels, as shown in FIG. 6, a first notch AX1 is disposed in the main part in each blue sub-pixel, and in the same repeating unit, an orthographical projection of the first notch AX1 in the second direction F2 covers an orthographical projection of the via hole part in the green sub-pixel in the second direction F2.

In some embodiments, when the first color sub-pixels spx1 are green sub-pixels and the second color sub-pixels spx2 are blue sub-pixels, as shown in FIG. 6, an edge of an orthographical projection of the first notch AX1 on the base substrate 10 is substantially parallel to an edge of an orthographical projection of the via hole part in the green sub-pixel on the base substrate 10. It needs to be noted that in a practical process, due to the limitation of process conditions or other factors such as wiring or via hole arrangement, as long as the above parallel relationship substantially meets the above conditions, the parallel relationship belongs to the scope of protection of the disclosure.

In some embodiments, when the first color sub-pixels spx1 are green sub-pixels and the second color sub-pixels spx2 are blue sub-pixels, as shown in FIG. 6, a first distance between the edge of the orthographical projection of the first notch AX1 on the base substrate 10 and the edge of the orthographical projection of the via hole part in the green sub-pixel on the base substrate 10 is not less than 2.5 μm. Further, the first distance may be 2.5 to 20 μm. For example, the first distance may be 2.5 μm, 3.5 μm or 20 μm, which is not limited here.

It needs to be noted that when the first color sub-pixels spx1 are green sub-pixels and the second color sub-pixels spx2 are blue sub-pixels, arrangement of the red sub-pixels in the repeating units may refer to that of the above red sub-pixels, which is not repeated here.

Based on the same inventive concept, an embodiment of the disclosure further provides a display device which includes the display panel as provided by the embodiment of the disclosure. The display device may be any product or component with a display function, such as a mobile phone, a tablet computer, a television, a display, a notebook computer, a digital photo frame and a navigator. Other essential components of the display device will be apparent to those of ordinary skill in the art and are not described in detail herein, nor should they be construed as limiting the disclosure. The embodiment of the display device can be referred to the embodiment of the above-mentioned display panel, which will not be repeated here.

Although preferred embodiments of the disclosure have been described, additional alterations and modifications of these embodiments will occur to those skilled in the art upon attaining the basic inventive concept. It is therefore intended that the appended claims be interpreted as including the preferred embodiments and all such alterations and modifications as fall within the true scope of the disclosure.

It will be apparent to those skilled in the art that various modifications and variations can be made to the embodiments of the disclosure without departing from the spirit or scope of the embodiments of the disclosure. Thus, it is intended that the disclosure covers these modifications and variations provided they come within the scope of the appended claims and their equivalents.

What is claimed is:

1. A display panel, having a plurality of sub-pixels and comprising:
   a base substrate;
   a transistor array layer disposed on the base substrate and comprising anode adaptor portions each located in a respective one of the plurality of sub-pixels;
   a first planarization layer, disposed on a side of the transistor array layer facing away from the base substrate; and
   a first electrode layer, disposed on a side of the first planarization layer facing away from the base substrate and comprising anodes each located in the respective one of the plurality of sub-pixels; wherein
     each anode comprises a main part and a via hole part electrically connected to each other;
     in the respective one of the plurality of sub-pixels: the via hole part is electrically connected with the anode adaptor portion through a first via hole; and the first via hole runs through the first planarization layer;
   wherein
     the plurality of sub-pixels comprise first color sub-pixels and second color sub-pixels adjacent to the first color sub-pixels in a first direction; and orthographical projections of first via holes in the first color sub-pixels on the base substrate are located between orthographical projections of main parts in the first color sub-pixels on the base substrate and orthographical projections of main parts in the second color sub-pixels on the base substrate;
     for the first color sub-pixels and the second color sub-pixels adjacent to the first color pixels in the first direction, sides of orthographical projections of anodes in the second color sub-pixels on the base substrate facing to orthographical projections of anodes in the first color sub-pixels on the base substrate have first notches; and the first notches are convex toward centers of the main parts of the second color sub-pixels;
   wherein the display panel comprises a plurality of repeating units, and each repeating unit comprises at least one of the first color sub-pixels and at least one of the second color sub-pixels; and
   every two adjacent repeating units have at least two of the first notches and two of the first via holes; and in the first direction, the at least two of the first notches and the at least two of the first via holes of at least two adjacent repeating units are arranged on a same straight line.

2. The display panel according to claim 1, wherein in a same repeating unit, an orthographical projection of the first notch for the anode in the second color sub-pixel in a second direction covers an orthographical projection of the first via hole in the first color sub-pixel in the second direction.

3. The display panel according to claim 2, wherein
   in a same sub-pixel, an orthographical projection of the via hole part on the base substrate covers an orthographical projection of the first via hole on the base substrate; and
   the first notch is provided in the main part in the second color sub-pixel, and an orthographical projection of the first notch in the second direction covers an orthographical projection of the via hole part in the first color sub-pixel in the second direction.

4. The display panel according to claim 3, wherein an edge of the orthographical projection of the first notch on the base substrate is substantially parallel to an edge of the orthographical projection of the via hole part in the first color sub-pixel on the base substrate.

5. The display panel according to claim 4, wherein a first distance between the edge of the orthographical projection of the first notch on the base substrate and the edge of the orthographical projection of the via hole part in the first color sub-pixel on the base substrate is 2.5 to 20 μm.

6. The display panel according to claim 3, wherein the anodes in the first color sub-pixels further comprise first connecting parts electrically connected between the main parts and the via hole parts; and the first connecting parts extend in the first direction.

7. The display panel according to claim 3, wherein the anodes in the second color sub-pixels further comprise second connecting parts electrically connected between the main parts and the via hole parts;

the second connecting parts extend in a third direction; and the third direction is different from the first direction and the second direction.

8. The display panel according to claim 2, wherein each repeating unit further comprises at least one third color sub-pixel; and anodes in a first color sub-pixel, a second color sub-pixel and a third color sub-pixel which are adjacent to one another locates respectively at three vertices of a triangle.

9. The display panel according to claim 8, wherein in the same repeating unit, an orthographical projection of the first via hole in the second color sub-pixel on the base substrate is located between orthographical projections of the via hole part in the first color sub-pixel and a main part in the third color sub-pixel on the base substrate, orthographical projections of the first via hole in the second color sub-pixel, the via hole part in the first color sub-pixel and the main part in the third color sub-pixel on the base substrate are disposed on a same straight line, and the straight line is substantially parallel to the first direction.

10. The display panel according to claim 9, wherein in the same repeating unit, a side of the orthographical projection of the main part in the third color sub-pixel on the base substrate facing the orthographical projection of the first via hole in the second color sub-pixel on the base substrate has a second notch.

11. The display panel according to claim 8, wherein an orthographical projection of a first via hole in each third color sub-pixel on the base substrate is disposed on a side of the orthographical projection of each second notch on the base substrate facing away from the orthographical projection of the via hole part in each second color sub-pixel on the base substrate.

12. The display panel according to claim 8, wherein in the same repeating unit, the orthographical projection of the anode in the third color sub-pixel on the base substrate partially overlaps respectively with orthographical projections of the reset line and the light emitting control line controlling a pixel circuit in the same repeating unit on the base substrate.

13. The display panel according to claim 8, wherein the first via holes in the repeating units which are adjacent in the second direction are approximately arranged in the second direction in sequence.

14. The display panel according to claim 1, wherein the first color sub-pixels are red sub-pixels, and the second color sub-pixels are green sub-pixels; and the transistor array layer comprises driving transistors located in the respective one of the plurality sub-pixels; and orthographical projections of anodes in the green sub-pixels on the base substrate and orthographical projections of channel regions of the driving transistors in the red sub-pixels on the base substrate have overlapping areas.

15. The display panel according to claim 1, wherein the transistor array layer further comprises an active layer of conducting control transistors in the plurality of sub-pixels; and in a same sub-pixel, the anode adaptor portion is electrically connected with a conductor region of the active layer of the conducting control transistor through a second via hole;

orthographical projections of first via holes and second via holes in the red sub-pixels on the base substrate have first overlapping areas;

orthographical projections of first via holes and second via holes in the green sub-pixels on the base substrate have second overlapping areas; and an area of each first overlapping area is not greater than an area of each second overlapping area.

16. The display panel according to claim 1, wherein the first color sub-pixels are green sub-pixels, and the second color sub-pixels are blue sub-pixels; and orthographical projections of anodes in the blue sub-pixels on the base substrate and orthographical projections of channel regions of driving transistors in the green sub-pixels on the base substrate have overlapping areas.

17. A display panel having comprising a plurality of sub-pixels and comprising:

a base substrate;

a transistor array layer, disposed on the base substrate and comprising anode adaptor portions each located in a respective one of the plurality of sub-pixels;

a first planarization layer, disposed on a side of the transistor array layer facing away from the base substrate;

a first electrode layer, disposed on a side of the first planarization layer facing away from the base substrate and comprising anodes each located in the respective one of the plurality of sub-pixels; wherein an anode in each sub-pixel are electrically connected with the anode adaptor portion through a first via hole; the first via hole runs through the first planarization layer; and each anode comprises a main part and a via hole part; and a pixel defining layer, disposed on a side of the first electrode layer facing away from the base substrate and comprising openings each located in the respective one of the plurality of sub-pixels, wherein in a same sub-pixel: an orthographical projection of an opening on the base substrate is located in an orthographical projection of an anode on the base substrate; wherein the plurality of sub-pixels comprise third color sub-pixels; and in each third color sub-pixel, a side of the orthographical projection of the opening on the base substrate facing an orthographical projection of a first via hole in the third color sub-pixel on the base substrate has an opening notch; and in each third color sub-pixel, a side of an orthographical projection of the main part of the anode on the base substrate facing to an orthographical projection of the first via hole of the anode of the third color sub-pixel on the base substrate has a third notch, and the third notch is substantially parallel to the opening notch.

18. The display panel according to claim 17, wherein in each third color sub-pixel, an orthographical projection of the opening notch in a first direction covers an orthographical projection of the first via hole in the first direction.

19. The display panel according to claim 17, wherein in each third color sub-pixel, an edge of an orthographical projection of the third notch on the base substrate and the edge of the orthographical projection of the opening notch on the base substrate are overlapped.

20. The display panel according to claim 17, wherein the plurality of sub-pixels further comprise: first color sub-pixels and second color sub-pixels; and in at least one of the first color sub-pixels and the second color sub-pixels, an orthographical projection of an opening on the base substrate is rectangular.

\* \* \* \* \*